US012658854B1

(12) United States Patent
Buckwalter et al.

(10) Patent No.: US 12,658,854 B1
(45) Date of Patent: Jun. 16, 2026

(54) DUAL-POLARIZATION AND DUAL-BAND RADIO FREQUENCY (RF) TRANSCEIVERS WITH LEAKAGE AND IMAGE REJECTION CALIBRATION

(71) Applicant: PseudolithIC, Inc., Santa Barbara, CA (US)

(72) Inventors: James F. Buckwalter, Santa Barbara, CA (US); Alexander H. Dinkelacker, Santa Barbara, CA (US); Florian Herrault, Agoura Hills, CA (US)

(73) Assignee: PseudolithIC, Inc., Santa Barbara, CA (US)

( * ) Notice: Subject to any disclaimer, the term of this patent is extended or adjusted under 35 U.S.C. 154(b) by 0 days.

(21) Appl. No.: 19/310,777

(22) Filed: Aug. 26, 2025

(51) Int. Cl.
| | |
|---|---|
| *H03D 7/16* | (2006.01) |
| *H03D 3/00* | (2006.01) |
| *H04B 1/00* | (2006.01) |
| *H04B 1/30* | (2006.01) |

(52) U.S. Cl.
CPC ............. *H03D 7/165* (2013.01); *H03D 3/009* (2013.01); *H04B 1/0096* (2013.01); *H04B 1/30* (2013.01); *H03D 2200/0025* (2013.01); *H03D 2200/009* (2013.01); *H04B 2001/307* (2013.01)

(58) Field of Classification Search
CPC ............. H03D 7/165; H03D 2200/009; H03D 2200/0025; H03D 3/009; H04B 1/30; H04B 1/0096; H04B 2001/307
See application file for complete search history.

(56) References Cited

U.S. PATENT DOCUMENTS

| | | | | |
|---|---|---|---|---|
| 2014/0080437 A1* | 3/2014 | Lin | ........................... | H04B 1/30 |
| | | | | 455/326 |
| 2020/0119746 A1* | 4/2020 | Wong | ...................... | H03M 1/66 |
| 2023/0168211 A1* | 6/2023 | Zeinolabedinzadeh | .. | H03D 1/24 |
| | | | | 342/22 |
| 2024/0214016 A1* | 6/2024 | Patel | ........................ | H04B 1/16 |

FOREIGN PATENT DOCUMENTS

CN       113098540 A  *  7/2021  ............... H04B 1/26

OTHER PUBLICATIONS (CN TW 201739000 A), Pei et al.,Isolation Structures For Circuits Sharing A Substrate, Nov. 2017,pp. 1-7 (Year: 2017).*

* cited by examiner

*Primary Examiner* — Keith Ferguson
(74) *Attorney, Agent, or Firm* — Van Pelt, Yi & James LLP

(57) ABSTRACT

Technologies, devices, systems and methods herein include a system for receiving or transmitting signals. The system includes a radio frequency (RF) port configured to receive or transmit an RF signal including an upper side band (USB) and a lower side band (LSB); a first mixer coupled with the RF port and configured to convert between the RF signal and an image (IM) band and an RF band; and selection architecture, coupled with the first mixer and including a second mixer, the selection architecture configured to output or receive the USB and the LSB based on the RF band and the IM band.

19 Claims, 18 Drawing Sheets

*The plus/minus means the LO could be above or below the RF band.*

$$\pm f_{IF} = f_{RF} - f_{LO}$$

$$f_{IM} = f_{LO} \pm f_{IF}$$

$$\text{where} \quad f_{RF} = f_{LO} \mp f_{IF}$$

$$IRR = \frac{G_C(f_{RF})}{G_C(f_{IM})}$$

140

Figure 2B:
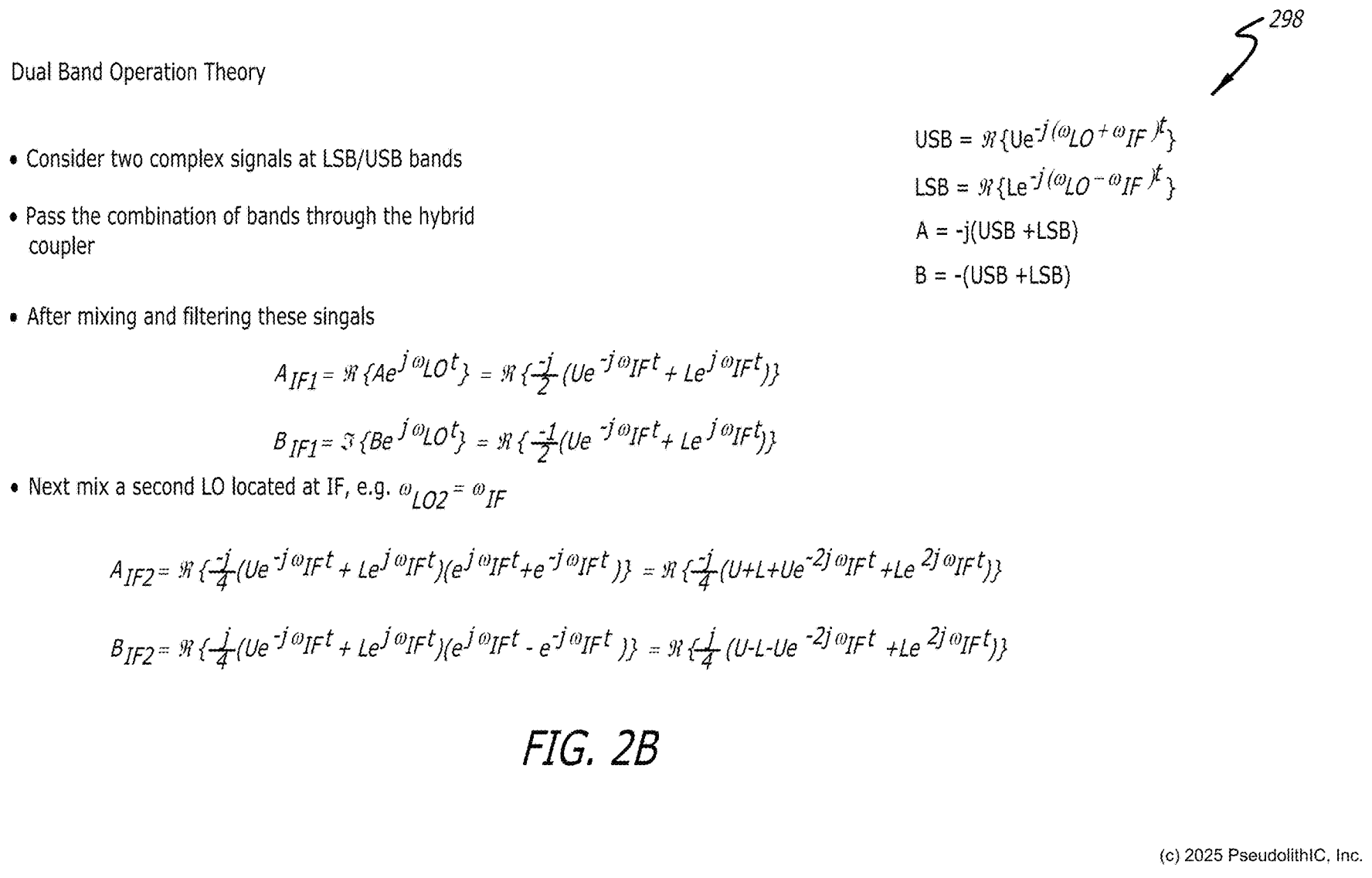

298

Dual Band Operation Theory

- Consider two complex signals at LSB/USB bands

- Pass the combination of bands through the hybrid coupler

- After mixing and filtering these singals $$A_{IF1} = \Re\{Ae^{j\omega_{LO}t}\} = \Re\{\tfrac{-j}{2}(Ue^{-j\omega_{IF}t} + Le^{j\omega_{IF}t})\}$$

$$B_{IF1} = \Im\{Be^{j\omega_{LO}t}\} = \Re\{\tfrac{-1}{2}(Ue^{-j\omega_{IF}t} + Le^{j\omega_{IF}t})\}$$

- Next mix a second LO located at IF, e.g. $\omega_{LO2} = \omega_{IF}$ $$A_{IF2} = \Re\{\tfrac{-j}{4}(Ue^{-j\omega_{IF}t} + Le^{j\omega_{IF}t})(e^{j\omega_{IF}t} + e^{-j\omega_{IF}t})\} = \Re\{\tfrac{-j}{4}(U+L+Ue^{-2j\omega_{IF}t}+Le^{2j\omega_{IF}t})\}$$

$$B_{IF2} = \Re\{\tfrac{-1}{4}(Ue^{-j\omega_{IF}t} + Le^{j\omega_{IF}t})(e^{j\omega_{IF}t} - e^{-j\omega_{IF}t})\} = \Re\{\tfrac{-1}{4}(U-L-Ue^{-2j\omega_{IF}t}+Le^{2j\omega_{IF}t})\}$$

$$USB = \Re\{Ue^{-j(\omega_{LO}+\omega_{IF})t}\}$$

$$LSB = \Re\{Le^{-j(\omega_{LO}-\omega_{IF})t}\}$$

$$A = -j(USB+LSB)$$

$$B = -(USB+LSB)$$

Dual Band Operation Theory

- After mixing and filtering these signals $$A_{IF2} = \Re\{\frac{-j}{4}(Ue^{-j\omega_{IF}t} + Le^{j\omega_{IF}t})(e^{j\omega_{IF}t} + e^{-j\omega_{IF}t})\} = \Re\{\frac{-j}{4}(U + L + Ue^{-2j\omega_{IF}t} + Le^{2j\omega_{IF}t})\}$$

$$B_{IF2} = \Re\{\frac{-j}{4}(Ue^{-j\omega_{IF}t} + Le^{j\omega_{IF}t})(e^{j\omega_{IF}t} - e^{-j\omega_{IF}t})\} = \Re\{\frac{-j}{4}(U - L - Ue^{-2j\omega_{IF}t} + Le^{2j\omega_{IF}t})\}$$

- Sum and difference $$USB = A_{IF2} + B_{IF2} = \Re\{\frac{-j}{2}(L - Ue^{-2j\omega_{IF}t})\}$$

$$LSB = B_{IF2} - A_{IF2} = \Re\{\frac{-j}{2}(U - Le^{2j\omega_{IF}t})\}$$

- Filter and evaluate $$USB = \Re\{j\frac{U_I - U_Q}{2}e^{-2j\omega_{IF}t}\} = \frac{1}{2}(U_I \sin(2\omega_{IF}t) + U_Q \cos(2\omega_{IF}t))$$

$$LSB = \Re\{-j\frac{L_I - L_Q}{2}e^{2j\omega_{IF}t}\} = \frac{1}{2}(L_I \sin(2\omega_{IF}t) + L_Q \cos(2\omega_{IF}t))$$

- This shows that the complex LSB and USB components are separable

*FIG. 2C*

- Consider two complex polarizations (V and H plane)

$$V = V_I + jV_Q$$
$$H = H_I + jH_Q$$

- Pass these polarizations through a hybrid coupler A/B represent the signals at the mixer.

$$A = -jV - H$$
$$B = -jH - V$$

- The down converted IF signals are represented by $$A_{IF} = \Re\{Ae^{j\omega_{IF}t}\}$$
$$B_{IF} = \Im\{Be^{j\omega_{IF}t}\}$$

where   $\omega_{IF} = \omega_{RF} - \omega_{LO}$ $$A_{IF} = \Re\{(V_Q - H_I - j(V_I + H_Q))e^{j\omega_{IF}t}\}$$
$$A_{IF} = (V_Q - H_I)\cos(\omega_{IF}t) + (V_I + H_Q)\sin(\omega_{IF}t)$$

$$B_{IF} = \Im\{(H_Q - V_I - j(V_Q + H_I))e^{j\omega_{IF}t}\}$$
$$B_{IF} = (V_Q + H_I)\cos(\omega_{IF}t) - V_I\sin(\omega_{IF}t) + H_Q\sin(\omega_{IF}t)$$

$$I = B_{IF} - A_{IF} = H_I\cos(\omega_{IF}t) - V_I\sin(\omega_{IF}t)$$
$$Q = A_{IF} + B_{IF} = V_Q\cos(\omega_{IF}t) + H_Q\sin(\omega_{IF}t)$$

$$I = H_I \cos(\omega_{IF} t) - V_I \sin(\omega_{IF} t)$$

$$Q = V_Q \cos(\omega_{IF} t) + H_Q \sin(\omega_{IF} t)$$

- By mixing with quadrature phases, e.g. $\cos(w_{IF}t)$ and $\sin(w_{IF}t)$, the (HI, HQ) are separated from (VI, VQ)

- This would be accomplished with a second set I/Q down converters on the I and Q ports.

*FIG. 3C*

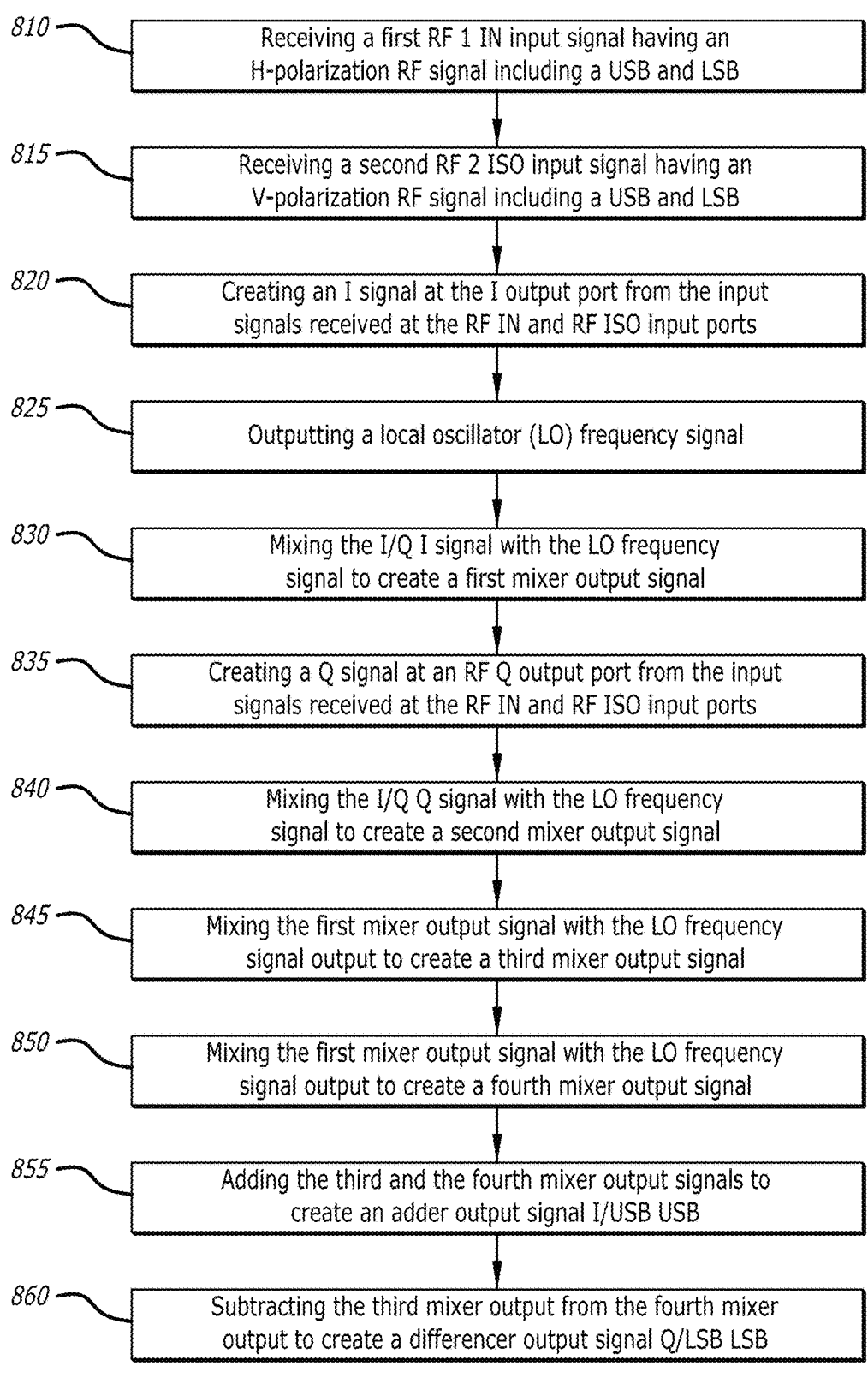

810 — Receiving a first RF 1 IN input signal having an H-polarization RF signal including a USB and LSB 815 — Receiving a second RF 2 ISO input signal having an V-polarization RF signal including a USB and LSB 820 — Creating an I signal at the I output port from the input signals received at the RF IN and RF ISO input ports 825 — Outputting a local oscillator (LO) frequency signal 830 — Mixing the I/Q I signal with the LO frequency signal to create a first mixer output signal 835 — Creating a Q signal at an RF Q output port from the input signals received at the RF IN and RF ISO input ports 840 — Mixing the I/Q Q signal with the LO frequency signal to create a second mixer output signal 845 — Mixing the first mixer output signal with the LO frequency signal output to create a third mixer output signal 850 — Mixing the first mixer output signal with the LO frequency signal output to create a fourth mixer output signal 855 — Adding the third and the fourth mixer output signals to create an adder output signal I/USB USB 860 — Subtracting the third mixer output from the fourth mixer output to create a differencer output signal Q/LSB LSB

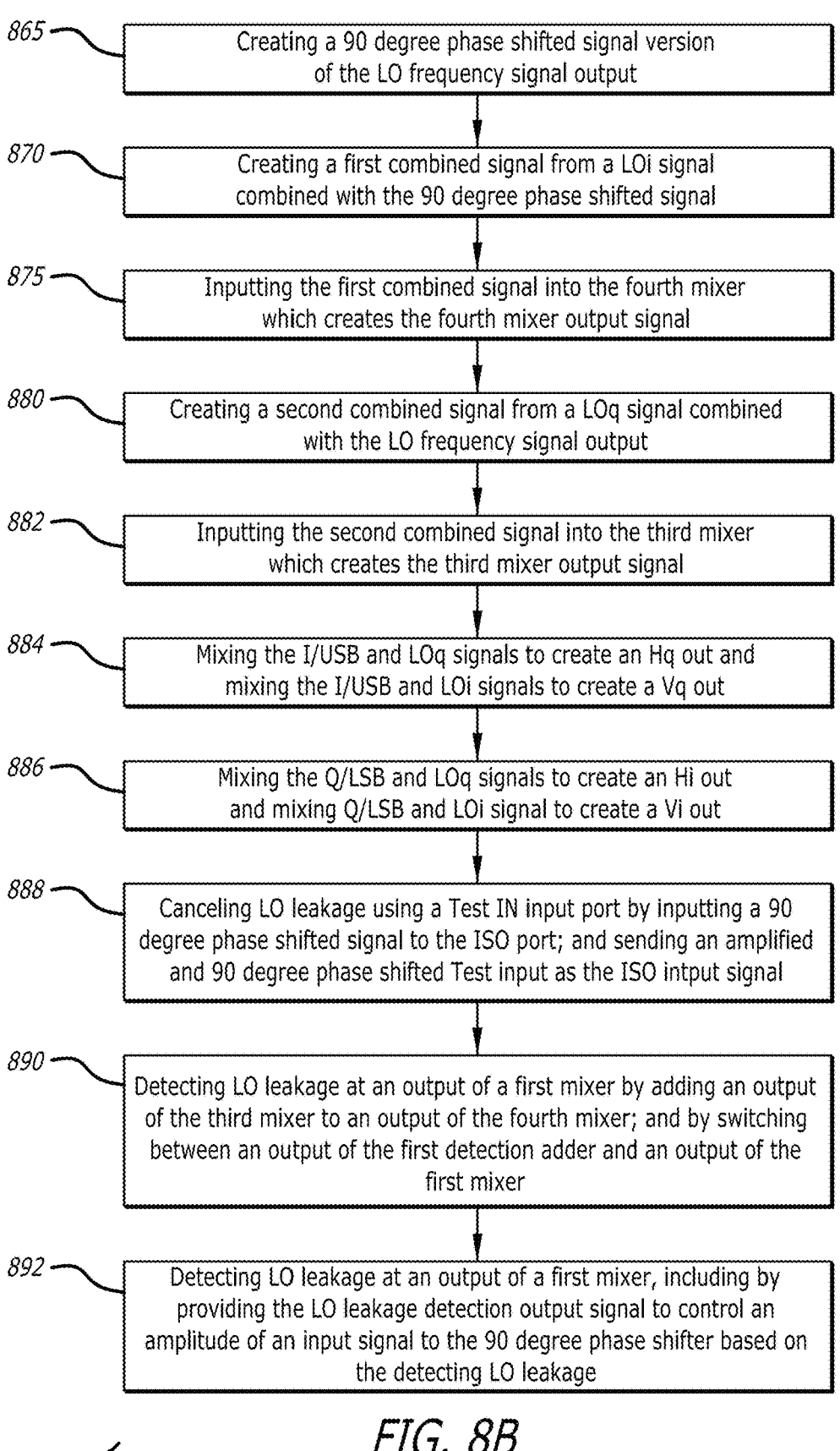

865 — Creating a 90 degree phase shifted signal version of the LO frequency signal output 870 — Creating a first combined signal from a LOi signal combined with the 90 degree phase shifted signal 875 — Inputting the first combined signal into the fourth mixer which creates the fourth mixer output signal 880 — Creating a second combined signal from a LOq signal combined with the LO frequency signal output 882 — Inputting the second combined signal into the third mixer which creates the third mixer output signal 884 — Mixing the I/USB and LOq signals to create an Hq out and mixing the I/USB and LOi signals to create a Vq out 886 — Mixing the Q/LSB and LOq signals to create an Hi out and mixing Q/LSB and LOi signal to create a Vi out 888 — Canceling LO leakage using a Test IN input port by inputting a 90 degree phase shifted signal to the ISO port; and sending an amplified and 90 degree phase shifted Test input as the ISO intput signal 890 — Detecting LO leakage at an output of a first mixer by adding an output of the third mixer to an output of the fourth mixer; and by switching between an output of the first detection adder and an output of the first mixer 892 — Detecting LO leakage at an output of a first mixer, including by providing the LO leakage detection output signal to control an amplitude of an input signal to the 90 degree phase shifter based on the detecting LO leakage

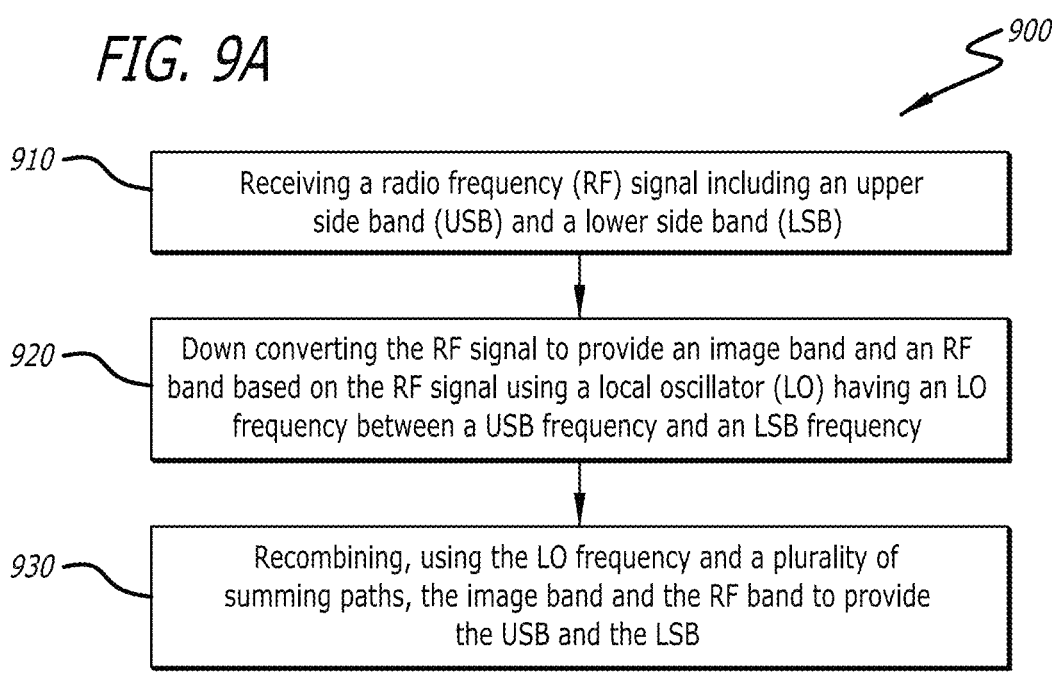

910 — Receiving a radio frequency (RF) signal including an upper side band (USB) and a lower side band (LSB)

920 — Down converting the RF signal to provide an image band and an RF band based on the RF signal using a local oscillator (LO) having an LO frequency between a USB frequency and an LSB frequency 930 — Recombining, using the LO frequency and a plurality of summing paths, the image band and the RF band to provide the USB and the LSB

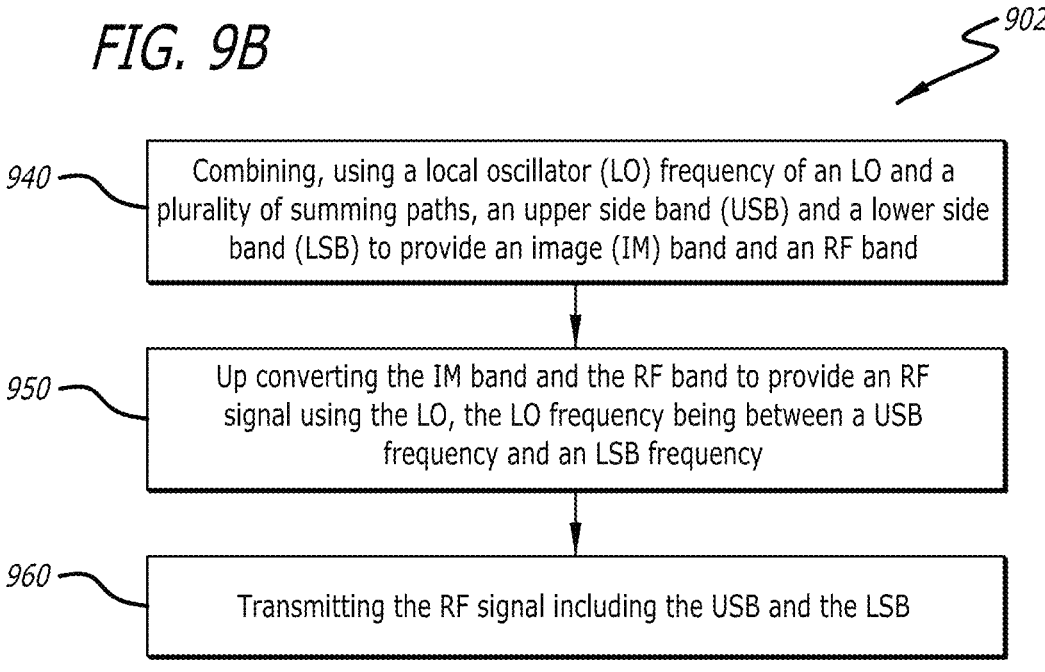

940 — Combining, using a local oscillator (LO) frequency of an LO and a plurality of summing paths, an upper side band (USB) and a lower side band (LSB) to provide an image (IM) band and an RF band 950 — Up converting the IM band and the RF band to provide an RF signal using the LO, the LO frequency being between a USB frequency and an LSB frequency 960 — Transmitting the RF signal including the USB and the LSB

DUAL-POLARIZATION AND DUAL-BAND RADIO FREQUENCY (RF) TRANSCEIVERS WITH LEAKAGE AND IMAGE REJECTION CALIBRATION

NOTICE OF COPYRIGHTS AND TRADE DRESS

BACKGROUND

Field

This disclosure relates to dual-polarization and/or dual-band radio frequency (RF) transceivers and receivers with leakage and image rejection calibration.

Description of the Related Art

Millimeter-wave receivers (MWR) are devices that detect and process electromagnetic radiation in the millimeter-wave frequency range (30-300 GHz). They are crucial components in various technologies, including telecommunications, radar, and imaging systems. These receivers are often used where high bandwidth and short-range communication are needed, such as in fifth generation (5G) radio frequency (RF) technology and short-range radar systems. Their goal is to capture radio waves, extract the desired information, and convert it into a usable form. This usable form could be audio, video, or digital data, depending on the application. Essentially, the receiver takes the incoming radio frequency (RF) signal and separates the desired information from noise and other signals, then processes it for further use.

MWRs are important for detecting weak radio frequency or millimeter-wave signals and amplifying these to demodulation information sent over the millimeter-wave band. Current United States Federal Communications Commission (US FCC) regulations allow communication in a number of radio frequency (RF) bands including millimeter-wave bands. As an example, there are licensed receivers for the E-band at 71-76 GHz and 81-86 GHz. In the E-band, 71-76 GHz may be referred to as the lower sideband (LSB) and 81-86 GHz as the upper sideband (USB). E-band is currently a band for exploration in satellite communication as well as terrestrial backhaul (e.g., see the US FCC article regarding Partial Grant of SpaceX Gen2 Application to Allow E-Band Operations). These E-band receivers may be used for cell phone communication, base stations, internet communication and other RF needs.

Such MWRs are judged by their ability to provide high gain while adding very little noise and offering the ability to capture signals in different bands or with different polarizations. These receivers add not only noise to the signal but also introduce other impairments to the signal such as local oscillator leakage and in-phase and quadrature amplitude and phase imbalance. The power consumption required for these receivers is amortized by the number of polarizations or bandwidth of signals that it can receive.

As such, the performance of current commercial MWRs indicate difficulties in designing and fabricating a single RF receiver that operates in multiple bands or receives multiple polarizations. There are four main problems with the current solutions. First, they require two different receiver products or chips to recover 71-76 GHz and 81-86 GHz bands, see ADMV7410 (71-76 GHz) chip and ADMV7420 (81-86 GHz) chip. Second, each of these chips consumes 1 Watt (W) of power during operation, so recovering two polarizations or two different bands requires 2 W of power. Third, these products have limited image rejection ratio in a narrowband such as in 71-76 GHz due to the limitations of the product's amplitude and phase balance. Fourth, the noise figure of these products is not as low as might be possible due to compromises in their fabrication process.

Due to the deficiencies of the above noted MWRs, there exists a need for electronic assemblies having, and the ability to build such assemblies having, E-band receivers that maximize data rate at minimum power consumption by using multiple RF polarizations while receiving both LSB and USB bands. Satisfying this need will allow for receivers capable of simultaneously operating in both bands (71-76 GHz and 81-86 GHz) with two polarizations, while improving local oscillator (LO) leakage and image rejection ratio (IRR) through tuning techniques.

DESCRIPTION OF THE DRAWINGS

FIGS. 2B-2C show a dual band operating theory for an RF receiver.

FIG. 3B shows a simultaneous dual polarization operating theory for an RF receiver.

FIG. 3C shows how polarizations are separable for an RF receiver.

FIG. 8A shows a process flow for receiving a dual-polarization and dual frequency band radio frequency (RF) signal.

FIG. 8B shows a process flow for receiving a dual-polarization and dual frequency band radio frequency (RF) signal.

FIG. 9A shows process flow for receiving dual-polarization and/or dual frequency band radio frequency (RF) signals with leakage and image rejection calibration FIG. 9B shows process flow for transmitting a radio frequency (RF) signal. Process 902 may be performed by any transceiver herein.

Throughout this description, elements appearing in figures are assigned three-digit or four-digit reference designators, where the two least significant digits are specific to the element and the one or two most significant digit may be the figure number where the element is first introduced or fabricated. An element that is not described in conjunction with a figure may be presumed to have the same characteristics and function as a previously-described or subsequently-described element having the same reference designator and/or with the same two least significant digits.

DETAILED DESCRIPTION

Descriptions herein include dual-polarization and dual-band radio frequency (RF) transceivers with leakage and image rejection calibration. They may be part of millimeter-wave (MW) transceivers (e.g., transmitters and receivers of MW signals). These transceivers may be or include millimeter-wave receiver (MWR) electronic assemblies having, and the ability to build such MWR assemblies having, E-band transceivers that maximize data rate at minimum power consumption by using multiple RF polarizations while receiving both lower sideband (LSB) (71-76 GHz) and upper sideband (USB) (81-86 GHz) bands. Satisfying this need will allow for transceivers capable of simultaneously operating in both bands (71-76 GHz and 81-86 GHz) and/or with two polarizations, while improving local oscillator (LO) leakage and image rejection ratio (IRR) through tuning techniques.

The following may also describe improved MWR, use thereof and fabrication techniques thereof for these dual-polarization and dual-band RF transceivers with leakage and image rejection calibration. These transceivers may be implemented using (e.g., on or within) wafers, die, chips and fabrication techniques thereof for electronic assemblies having in-substrate chips (e.g., chiplets) integrated into wafer cavities of a wafer, such as using lateral bonding material that may be a dielectric.

Figure 1A:
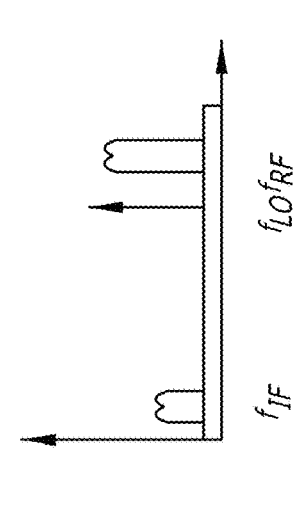
FIG. 1A shows a graph of amplitude and frequency including signals $f_{IF}$, $f_{RF}$ and $f_{LO}$.
Figure 1A:
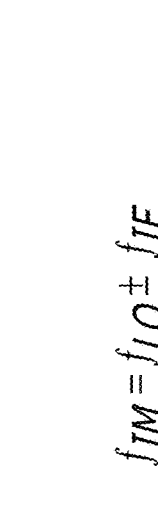

High image rejection and rejection calibration are beneficial features of an RF transceiver. A heterodyne receiver down-converts an RF band to an intermediate frequency (IF) band based on the local oscillator (LO) frequency, e.g., $+f_{IF}=f_{RF}-f_{LO}$, where $f_{IF}$ is the frequency of the IF, $f_{RF}$ is the frequency of the RF and $f_{LO}$ is the frequency of the LO. In this equation, the + symbol means that the LO frequency could be above or below the RF band frequency. A heterodyne transmitter up-converts data (e.g., LSB and USB) into an RF band by multiplying or modulating the data with an intermediate frequency (IF) band based on a local oscillator (LO) frequency. FIG. 1A shows graph 100 of amplitude (vertical axis) and frequency (horizontal axis) for image reflection including signals $f_{IF}$, $f_{RF}$ and $f_{LO}$. LSB may be shown at the IF, while USB may be just below the LO frequency.

The use of a non-zero $f_{IF}$ leads to the existence of an image frequency band (IM) that makes the receiver sensitive to noise. The image band exists at $f_{IM}=f_{LO}+f_{IF}$, where $f_{RF}=f_{LO}+f_{IF}$. The image rejection ratio (IRR) is an indication of how well the heterodyne receiver rejects the image band.

A high image rejection ratio (IRR) is a beneficial feature of an RF receiver. IRR defines the ratio of signal amplitude mixed down from the RF frequency relative to signal amplitude mixed down from the IM frequency. IRR=$G_C$ $(f_{RF})/G_C(f_{IM})$, where G is the conversion gain from frequency $f_x$ to $f_{IF}$, where $f_x$ represents any frequency.

Figure 1B:
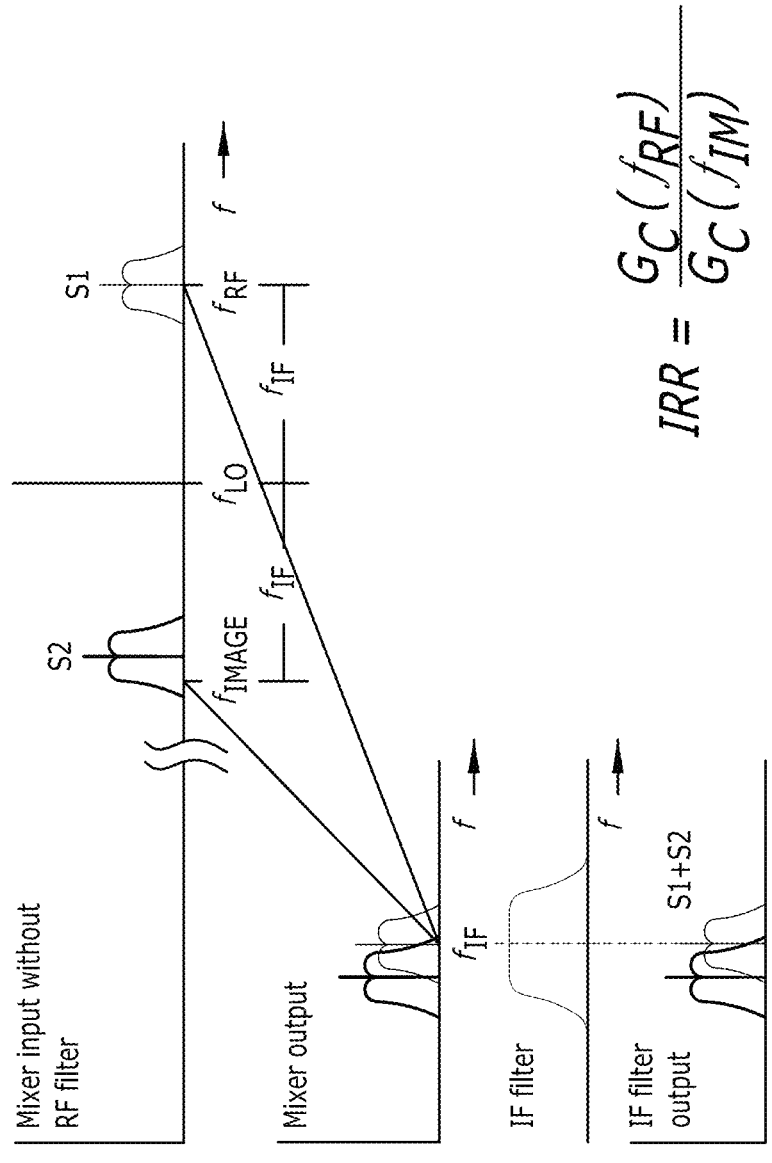
FIG. 1B shows graphs of signals $f_{IF}$, $f_{IM}$, $f_{RF}$ and $f_{LO}$.

FIG. 1B shows graphs 140 of amplitude (vertical axis) and frequency (horizontal axis) for image rejection ratio including signals $f_{IF}$, $f_{IMAGE}=f_{IM}$, $f_{RF}$ and $f_{LO}$. The first graph of FIG. 1B shows a graph of amplitude and frequency including signals $f_{IM}$ having amplitude S2, $f_{RF}$ having amplitude S1, $f_{LO}$ as a frequency spike, and the frequency range of $f_{IF}$. This first graph shows a Mixer input of signals $f_{IM}$, $f_{RF}$ and $f_{LO}$ without using an RF filter. Frequency $f_{IM}$ may be below the "SS" hash split along the frequency axis below S2. The second graph of FIG. 1B shows a Mixer output from mixing the $f_{IM}$, $f_{RF}$ signals. The third graph of FIG. 1B shows an IF filter frequency band. The fourth graph of FIG. 1B shows the IF filter output from filtering the mixer output. Lowering or reducing the amplitude of $f_{IM}$ in an RF receiver is beneficial because it increases IRR (see FIG. 1B) of the RF receiver.

Figure 1C:
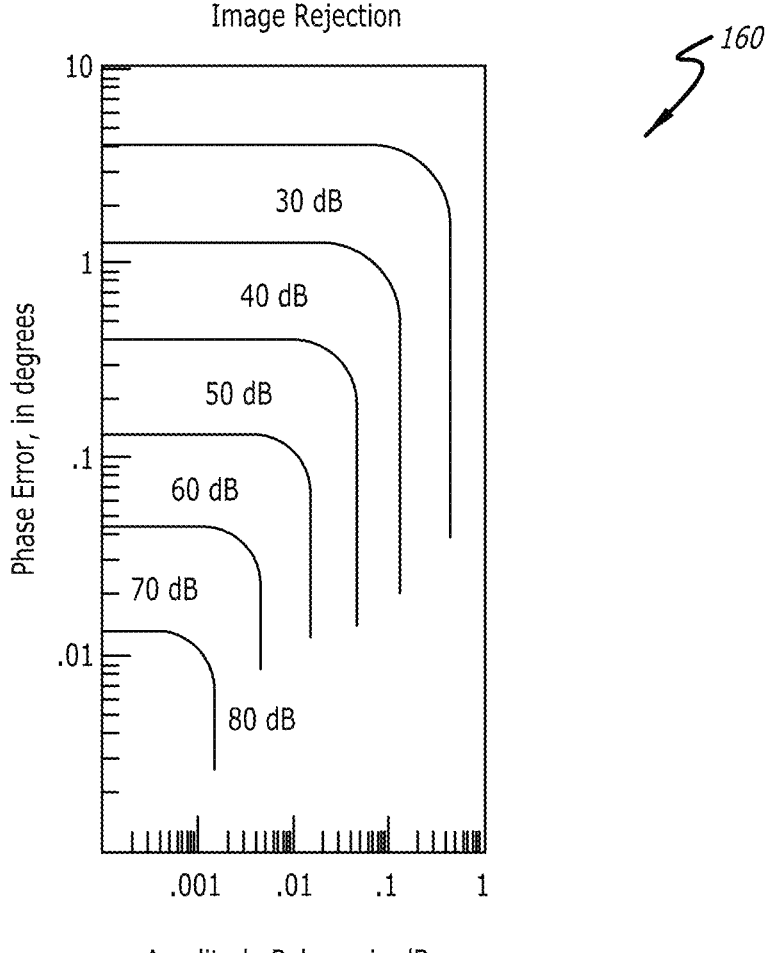
FIG. 1C shows graphs of phase error and amplitude balance for various example curves of image rejection or IRR or an RF receiver.

Beneficial and increased image rejection in an RF receiver can be accomplished by being able to tune the amplitude and phase the in-phase (I) and quadrature (Q) components of the received signal being signal processed by the receiver in two channels such as that the amplitude and phase of the signals in the two paths are identical but separated with 90 degree phase shift. FIG. 1C shows graphs 160 of phase error (vertical axis) and amplitude balance (horizontal axis) for various example curves of image rejection or image rejection ratio (IRR) for an RF receiver. Each example curve has a decibels (dB) number of amplitude error written below it, and a degrees of phase error on the vertical axis.

For some RF receivers, acceptable IRR is >20 decibels (dB). This corresponds to 1 dB of amplitude error and <7 degrees of phase error. This will incur a 0.1 dB noise figure penalty in the receiver but still be prone to jammer power levels. For some RF receivers, ideal IRR is >40 dB. This corresponds to 0.2 dB of amplitude error and <1 degree of phase error.

Thus, improved RF receivers (e.g., MWRs) and their methods of use are described herein that include dual-polarization and dual-band radio frequency (RF) receivers with leakage and image rejection calibration. The improved RF receiver technologies provide high gain while adding very little noise and offer the ability to capture signals in different RF bands and with different RF polarizations. The improved RF receiver technologies reduce noise added to the signal but also other impairments introduced to the signal such as local oscillator leakage and in-phase and quadrature amplitude and phase imbalance. The improved RF receiver technologies reduce the power consumption required for these receivers from being amortized by the number of polarizations or bandwidth of signals that it can receive by providing a single receiver having the ability to capture signals in different RF bands and with different RF polarizations.

Figure 2A:
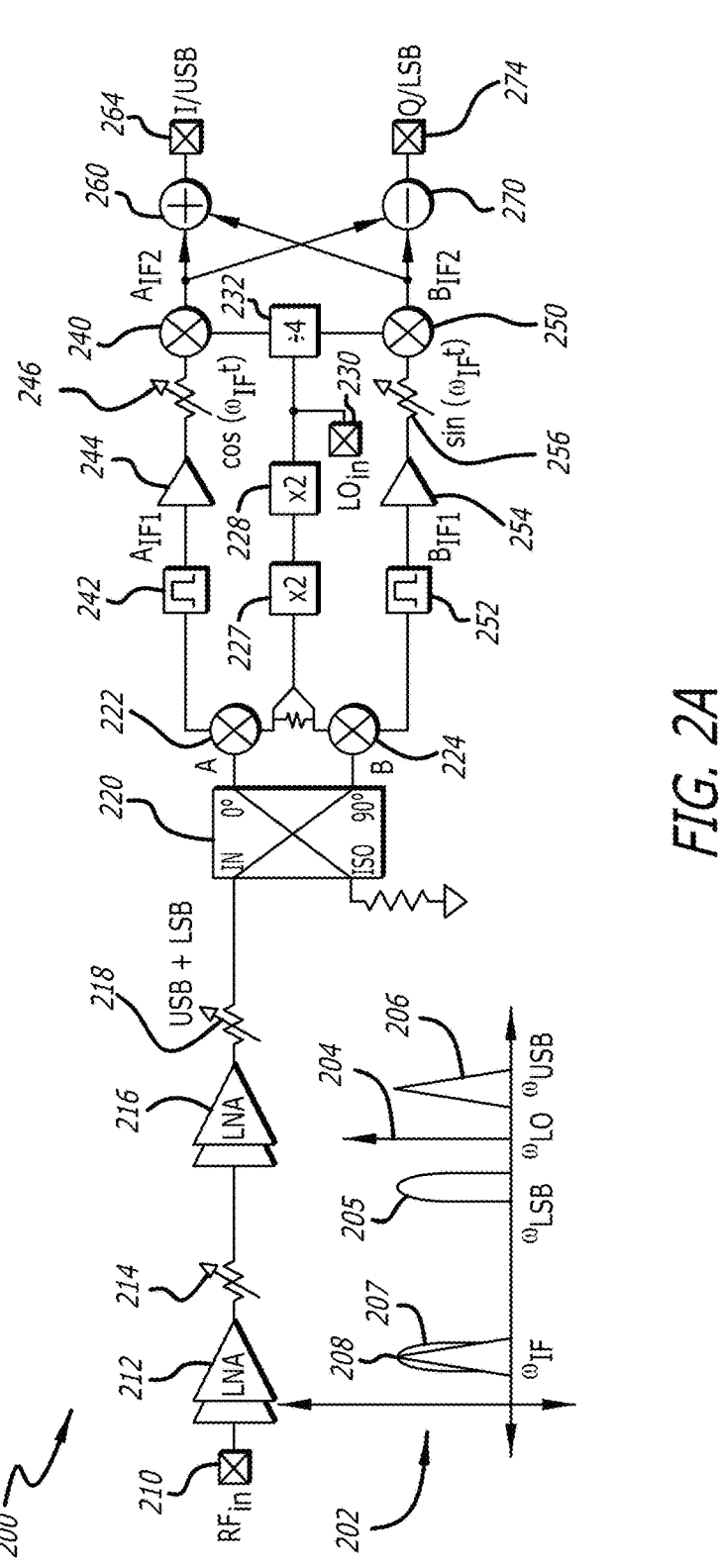
FIG. 2A is a circuit diagram of a single image selection I/Q receiver that can be used to simultaneously receive two different bands.
Figure 3A:
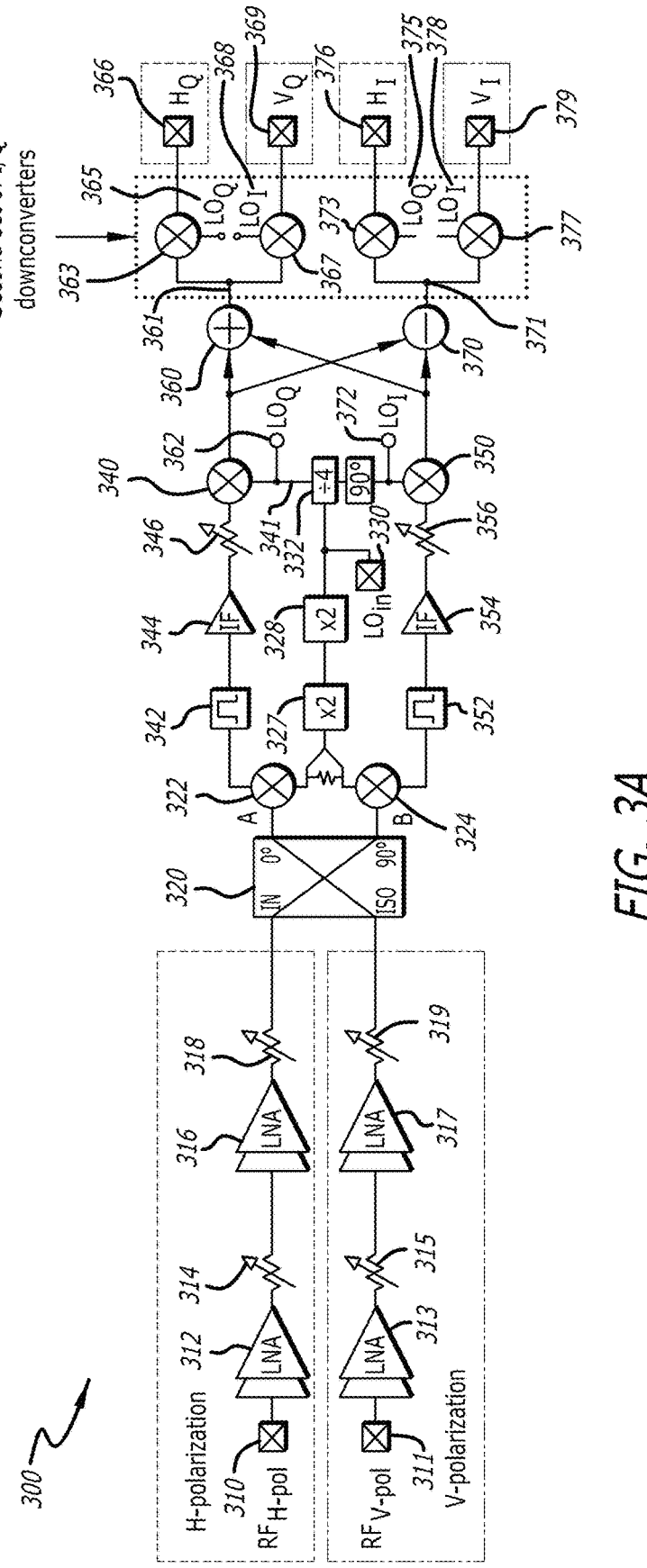
FIG. 3A is a circuit diagram of a single image selection I/Q receiver that can be used to simultaneously receive two different polarizations.

The following are examples of the improved RF receiver technologies herein. FIGS. 2A-2C show a single image selection I/Q receiver that can be used to simultaneously receive two different bands, the RF band and the image band. FIGS. 3A-3C show the image selection I/Q receiver of FIG. 2 that can also be used to simultaneously receive two different polarizations through the same signal path. FIGS.

4A-5 show the image selection I/Q receiver of FIGS. 2A-3C that can also cancel LO leakage through a tunable passive network on an RF hybrid coupler, such as by tuning out LO leakage and phase band signals. FIG. show the image selection I/Q receiver of FIGS. 2A-5 that can also adjust amplitude and phase imbalance by using a test port to inject the isolated port of hybrid coupler port and vice versa and eliminate the undesirable image components. A hybrid coupler is a passive RF component used in radio frequency and microwave systems to split or combine signals. It's a four-port device where an input signal is split into two output signals with a specific phase difference, typically 90 degrees, or where two signals can be combined with isolation between them.

The RF transceiver technologies herein provide new abilities including dual-polarization and dual-band radio frequency (RF) receivers and transmitters with leakage and image rejection calibration. The improved RF transceiver technologies herein provide RF receivers having operation in two different bands and/or polarizations that allow the data rate to be doubled without any substantial increase in power consumption. Typically, power consumption is 1 Watt per each different RF frequency band and polarization received. Thus, a two band and two polarization receiver requires 4 Watts. However, the improved RF receiver technologies herein provide two different bands and two different polarization receivers requiring only 1 or 2 Watts.

Description of Apparatus

An I/Q transceiver (or in-phase I and quadrature Q receiver) is a type of radio receiver that processes signals using both in-phase (I) and quadrature (Q) components. These components are two signals of the same frequency that are 90 degrees out of phase with each other (e.g., in the Z direction) of the wave as it propagates (e.g., in the Z direction). The I component is typically a cosine waveform, and the Q component is a sine waveform.

An I/Q receiver works using quadrature down conversion where the incoming RF signal is mixed with two versions of a LO signal. One of the LO signals is directly in phase (I) with the LO, and another is shifted by 90 degrees (Q) from the LO. This mixing process creates two baseband signals: the I and Q components.

For some improved receiver technologies herein, instead of splitting the LO frequency into I and Q bands, the improved receiver splits the incoming RF signal into the I and Q components and then mixes each with a version of a LO signal. This mixing process creates two baseband signals: the I and Q components.

"I" stands for In-Phase, referring to a signal component that is phase aligned with the reference carrier wave; and "Q" stands for Quadrature, referring to a signal component that is phase shifted by 90 degrees relative to the reference carrier wave. Together, I and Q components form the complex representation of a signal, enabling the receiver to extract both amplitude and phase information.

Low-pass filters may be used to remove the higher frequency components from the mixing. This leaves only the desired I and Q signals. These I and Q signals contain all the information about the original RF signal. This includes its amplitude and phase modulation. This allows the receiver to reconstruct the original signal. It can then be used for demodulating data, analyzing spectrum, or simply listening to the audio.

An I/Q transmitter works using quadrature up conversion where the outgoing RF signal is a mixture with two versions of a LO signal. For some improved transmitter technologies herein, instead of splitting the LO frequency into I and Q bands, the improved transmitter separately mixes each of the incoming I and Q components with a version of a LO signal. This mixing process creates two RF signals that can be combined to have the I and Q data components.

FIG. 2A is a circuit diagram of a single image selection I/Q receiver 200 that can be used to simultaneously receive two different bands, the RF band and the image (IM) band. The IM band, instead of being filtered or rejected as in a typical receiver, will be used to receive the LSB band while the USB band will be received as the RF band. If the IM band is undesired, it can be rejected through frequency filtering. Receiver 200 may be or be part of a dual-polarization and/or dual-band radio frequency (RF) receiver, such as a receiver to demodulate and decipher data in the LSB (71-76 GHz) and USB (81-86 GHz) bands. Receiver 200 is a dual-band radio frequency (RF) receiver.

Receiver 200 is capable of a single image-selection receiver architecture that can recover both the USB (81-86 GHz) band and LSB (71-76 GHz) band frequencies. By including two summing paths and taking the sum and different of the I/Q paths, the architecture of receiver 200 can simultaneously receive both frequency bands, extract the desired information from them, and convert it into a usable form from both bands at the same time.

Receiver 200 is or is part of an electronic receiver to I/Q demodulate (e.g., receive, demodulate from the RF carrier signal and signal process) a dual-polarization and/or a dual frequency band radio frequency (RF) input signal. Receiver 200 includes a hybrid coupler 220 having a radio frequency (RF) IN input port, an RF ISO input port, an RF 0 degree I/Q output port and an RF 90 degree I/Q output port. Coupler 220 may be a heterodyne hybrid coupler. Coupler 220 may be a quadrature coupler (also called a hybrid coupler). The RF IN input port of coupler 220 is configured to receive a RF IN input signal including an upper side band (USB) and a lower side band (LSB), such as received by an RF antennae or signal line (not shown). The RF IN port of coupler 220 is coupled to the $RF_{in}$ input port 210.

Herein, being "coupled" is and/or includes being electrically connected to, between and/or through electrically conductive wires, through vias, traces, contacts, passive components, active components and/or traces. Descriptions herein of being "configured to", "configured for", "to" and/or "for" performing an action include the ability to actually performing that action. For example, being configured to create a signal or output includes the ability to create that signal or output.

The RF IN input port of coupler 220 is coupled through a first set of low noise amplifiers (LNA) 212 and 216, and amplitude tuning attenuators 214 and 218 to the $RF_{in}$ port 210 as shown. In FIG. 2A, the RF ISO input port of coupler 220 is configured to be and is coupled to ground.

The coupler 220 is configured to create an I/Q I signal at the RF 0 degree I/Q output port from the input signals received at the RF IN and RF ISO input ports. The coupler 220 is configured to create an I/Q Q signal at the RF 90 degree I/Q output port from the input signals received at the RF IN and RF ISO input ports.

A local oscillator (LO) 230 is configured to output a LO frequency signal. This signal may have an amplitude at single frequency, such as at 19 GHz, or another frequency appropriate to down-sample the RF input signals as RF IN (and RF ISO in some embodiments). The LO may be multiplied up to a higher frequency, such as 78 GHz through a multiply-by-4 circuit, cause the RF input signal, for example at 83 GHz, to down-convert to a first IF at 5 GHz. The IM input signal, for example at 73 GHz, would also down-convert to a first IF at 5 GHz. The LO could also be divided down from 19 GHz to a second LO at 4.75 GHz. Then the RF and IM signal would be mixed to a second IF at 9.75 GHz.

First mixer 222 is coupled to the RF 0 degree I/Q output port to mix the I/Q I signal with the LO frequency signal from LO 230 to create a first mixer output signal. LO 230 is coupled to the mixer 222 through a set of ×2 frequency multipliers, 227 and 228 (e.g., a local oscillator (LO) multiplier chain).

Second mixer 224 is coupled to the RF 90 degree I/Q output port to mix the I/Q Q signal with the LO frequency signal from LO 230 to create a second mixer output signal. LO 230 is coupled to the mixer 224 through the set of ×2 multipliers, 227 and 228.

A third mixer 240 is coupled to the output of the first mixer 222 through a bandpass filter 242 outputting an $A_{IF1}$ signal to an amplifier 244 and an amplitude tuning attenuator 246. Mixer 240 is also coupled to the LO through a /4 frequency divider 232. Mixer 240 is configured to mix the first mixer output signal from mixer 222 with the LO frequency signal output $\cos(\omega_{IF}t)$ to create a third mixer output signal $A_{IF2}$. In a sense, mixer 240 mixes the 0 degree I/Q output I with the LO signal to down convert or down sample the I output of coupler 220 to obtain output signal $A_{IF2}$ which is used to create the LSB and USB signals.

A fourth mixer 250 is coupled to the output of the second mixer 224 through a bandpass filter 252 outputting an $B_{IF1}$ signal to an amplifier 254 and an amplitude tuning attenuator 256. Mixer 250 is also coupled to the LO through the frequency /4 divider 232. Mixer 250 is configured to mix the second mixer output signal from mixer 224 with the LO frequency signal output $\sin(\omega_{IF}t)$ to create a fourth mixer output signal $B_{IF2}$. In a sense, mixer 250 mixes the 90 degree I/Q output Q with the LO signal to down convert or down sample the Q output of coupler 220 to obtain output signal $B_{IF2}$ which is used to create the LSB and USB signals.

An adder 260 is configured to add the third mixer output $A_{IF2}$ signal and the fourth mixer output $B_{IF2}$ signal to create an adder output signal I/USB that is output to output port I/USB 264.

A differencer 270 is configured to subtract the third mixer output $A_{IF2}$ signal from the fourth mixer output $B_{IF2}$ signal to create a differencer output signal Q/LSB that is output to output port Q/LSB 274.

FIG. 2A also shows graph 202 having amplitude (vertical axis) and frequency (horizontal axis) including signals $\omega_{LSB}$ 205, $\omega_{LO}$ 204, and $\omega_{USB}$ 206. Graph 202 also includes OF having IF signal reflection/sideband 207 of $\omega_{LSB}$ 205 and IF signal reflection/sideband 208 of $\omega_{USB}$ 206. Output signal I/USB output to port I/USB 264 may be or include the USB signal 206. Output signal Q/LSB output to port Q/LSB 274 may be or include the LSB signal 205.

It is considered that from the 0 degree output of coupler 220 to mixer 260 is the I path of 0 degrees I signal, and that from the 90 degree output of coupler 220 to mixer 270 is the Q path of 90 degrees I signal. Thus, receiver 200 is a single image-selection receiver architecture that can recover both the USB (81-86 GHz) band and LSB (71-76 GHz) band frequencies by including two summing I and Q paths and taking the sum and different of the I/Q paths to simultaneously receive both frequency bands, extract the desired information from them, and convert it into a usable form. The concept of receiver 200 can be used to design dual-band radio frequency (RF) receivers for various other LSB and USB frequency bands.

FIG. 2A is a circuit diagram of a single image selection I/Q receiver 200 that can be used to simultaneously receive two different bands, the RF band and the image band. FIGS. 2B-2C show a dual band operating theory 298 and 299 for an RF receiver 200 using the variables identified for FIG. 2A. This theory shows that receiver 200 is a single image-selection receiver architecture that can recover both the USB (81-86 GHz) band and LSB (71-76 GHz) band frequencies by including two summing I and Q paths and taking the sum and different of the I/Q paths to simultaneously.

In some cases, receiver 200 is part of a transceiver, and can receive as noted, as well as transmit the RF signals from port 210 based on receiving and having the LSB and USB signals received at ports 264 and 274, respectively. For transmitting, there may be first and second data signals having the USB and LSB bands to be converted to RF signals for transmission at port 210. Transmitting may include add splitting the I/USB input at adder 260 and difference splitting the Q/LSB input at difference 270. Transmitting may include combining, using a local oscillator (LO) frequency of an LO 230 and a plurality of summing paths, (e.g., paths 242-240 and 252-250) an upper side band (USB) signal received at port 264 and a lower side band (LSB) received at port 274 to provide an image (IM) band and an RF band, such as coupled by the 0 degree and 90 degree ports of coupler 220 and output from the IN port, then transmitted from RF port 210. Transmitting may then include up converting the IM band and the RF band to provide an RF signal using the LO 230, the LO frequency being between a USB frequency and an LSB frequency, such as converting the RF band at mixers 240 and 222; and converting the IM band at mixers 250 and 224 before they go to the 0 degree and 90 degree ports of coupler 220. Transmitting may then include transmitting the RF signal including the USB and the LSB output from IN port of coupler 220 from RF port 210.

In the context of electromagnetic waves, particularly in RF, radar and satellite imaging, V and H polarization refer to the orientation of the electric field vector (e.g., in the X and Y direction) of the wave as it propagates (e.g., in the Z direction). "V" stands for vertical polarization, where the electric field oscillates in a vertical plane, and "H" stands for horizontal polarization, where the electric field oscillates in a horizontal plane.

FIG. 3A is a circuit diagram of a single image selection I/Q receiver 300 that can be used to simultaneously receive two different polarizations such as with one of two different bands, the RF band and the image band. Receiver 300 may be or be part of a dual-polarization and dual-band radio frequency (RF) receiver, such as a receiver to demodulate and decipher data of two different RF polarized signals each having the LSB (71-76 GHz) or the USB (81-86 GHz) band. Receiver 300 may be a dual-polarization and a dual-band radio frequency (RF) receiver.

In some cases, receiver 300 adds to the N1 RF input signal of receiver 200 receiving, demodulating and signal processing two different polarized RF signals with dual-polarization (V, H) rotations such as of the N1 RF input signal. Receiver 300 is capable of simultaneously receiving, demodulating and deciphering data of two different RF polarized signals and two different bands of each polarized signal by using a hybrid coupler 320 that provides the ability to inject one polarization into the "in" IN RF port and the other polarization into the "isolated" ISO RF port in the RF signal path. Complex signal components of the V and H polarization will be decomposed into the I and Q outputs by coupler 320 and the a single image-selection receiver architecture that can recover the USB (81-86 GHz) band or LSB (71-76 GHz) band frequencies using the two summing paths and taking the sum and different of the I/Q paths. A second set of I/Q down converters will then output the I and Q outputs for each of the V and H polarized signals. The architecture of receiver 300 can simultaneously receive both polarizations, extract the desired information from them, and convert it into a usable form from both polarizations at the same time.

Receiver 300 is or is part of an electronic receiver to I/Q demodulate (e.g., receive, demodulate from the RF carrier signal, and signal process) a dual-polarization radio frequency (RF) input signal. Receiver 300 includes a hybrid coupler 320 having a radio frequency (RF) IN input port, an RF ISO input port, an RF 0 degree I/Q output port and an RF 90 degree I/Q output port. Coupler 320 may be a quadrature coupler (also called a hybrid coupler). Coupler 320 may be a heterodyne and hybrid coupler. In some cases, coupler 320 is the same coupler as coupler 220, but receives different inputs at IN and ISO ports.

The RF IN input port of coupler 320 is configured to receive a RF 1 IN input signal having an H-polarization (e.g., 0 degree polarized) first RF signal including an upper side band (USB) and a lower side band (LSB), such as received from an RF antennae or RF signal line (not shown). The RF IN port of coupler 320 is coupled to the RF1$_{in}$ input port 310. The RF IN input port of coupler 320 is coupled through a first set of low noise amplifiers (LNA) 312 and 316, and amplitude tuning attenuators 314 and 318 to the RF1$_{in}$ port 310 as shown.

In FIG. 3A, the RF ISO input port of coupler 320 is configured to receive a RF 2 IN input signal having an V-polarization (e.g., 90 degree polarized) second RF signal including an upper side band (USB) and a lower side band (LSB), such as received from an RF antennae or RF signal line (not shown). The RF ISO port of coupler 320 is coupled to the RF2$_{in}$ input port 311. The RF ISO input port of coupler 320 is coupled through a first set of low noise amplifiers (LNA) 313 and 317, and amplitude tuning attenuators 315 and 319 to the RF2$_{in}$ port 311 as shown.

The coupler 320 is configured to create an I/Q I signal at the RF 0 degree I/Q output port from the input signals received at the RF IN and RF ISO input ports. The I/Q I output signal may be a combination of the RF 1 IN input signal having an H-polarization and the RF 2 IN input signal having an V-polarization.

The coupler 320 is configured to create an I/Q Q signal at the RF 90 degree I/Q output port from the input signals received at the RF IN and RF ISO input ports. The I/Q Q output signal may be a combination of the RF 1 IN input signal having an H-polarization and the RF 2 IN input signal having an V-polarization.

A local oscillator (LO) 330 is configured to output a LO frequency signal. This signal may have an amplitude at single frequency spike, such as at 10 GHz, or another frequency appropriate to down sample the RF input signals as RF IN (and RF ISO in some embodiments).

First mixer 322 is coupled to the RF 0 degree I/Q output port to mix the I/Q I signal with the LO frequency signal from LO 330 to create a first mixer output signal. LO 330 is coupled to the mixer 322 through a set of ×2 frequency multipliers, 327 and 328 (e.g., to form a local oscillator (LO) multiplier chain).

Second mixer 324 is coupled to the RF 90 degree I/Q output port to mix the I/Q Q signal with the LO frequency signal from LO 330 to create a second mixer output signal. LO 330 is coupled to the mixer 324 through the set of ×2 multipliers, 327 and 328.

A 90 degree phase shifter 380 is coupled between the/4 frequency divider 332 which is coupled to the LO 330 and fourth mixer 350. Shifter 380 is configured to create a 90 degree phase shifted signal version of the LO frequency signal output to be added to the local oscillator with local oscillator (LO) I phase added to the LO input of the fourth mixer by LO$_I$ port 372. As the second set of mixers (340 and 350) mix the IF signals the input ports with a quadrature (90 degree) phase shift, the output signals of these mixers are in phase and can be combined to select the V and H polarizations on different components of the summation frequency produced by the mixer through the summer (360) and differencer (370). A third set of mixers (363, 367 373, 377) decomposes the I and Q components on V and H to different baseband ports labelled 366 369 376 379. The quadrature LO (e.g., LO/4) input to the second mixers 340 and 350 produces a phase shift that combines to the quadrature phase shift through the hybrid coupler 320.

A LO$_Q$ signal generator or port 362 is coupled between the divider 332 and an input to mixer 340. Port 362 is configured to create a second combined signal 341 having the LO$_Q$ signal and the LO frequency signal output (e.g., $\cos(\omega_{IF}t)$) to be input into the third mixer to create the third mixer output signal.

A LO$_I$ signal generator or port 372 is coupled between the phase shifter 380 and an input to mixer 350. Port 372 is configured to create a second combined signal 351 having the LO$_I$ signal and the 90 degree phase shifted LO frequency signal output (e.g., $\sin(\omega_{IF}t)$) to be input into the fourth mixer to create the fourth mixer output signal.

A third mixer 340 is coupled to the output of the first mixer 322 through a bandpass filter 342 outputting an output signal to an amplifier 344 and an amplitude tuning attenuator 346. Mixer 340 is also coupled to the second combined signal 341 from the LO through the /4 frequency divider 332. Mixer 340 is configured to mix the first mixer output signal from mixer 322 with the second combined signal 341 to create a third mixer output signal. In a sense, mixer 340 mixes the 0 degree I/Q output I with the LO signal to down convert or down sample the I output of coupler 320 to obtain its output signal which is used to create the LSB and USB signals for both polarizations V and H.

A fourth mixer 350 is coupled to the output of the second mixer 324 through a bandpass filter 352 outputting an output signal to an amplifier 354 and an amplitude tuning attenuator 356. Mixer 350 is also coupled to the second combined signal 351 from the LO through the frequency/4 divider 332. Mixer 350 is configured to mix the second mixer output signal from mixer 324 with the second combined signal 341 to create a fourth mixer output signal. In a sense, mixer 350 mixes the 90 degree I/Q output Q with the LO signal to down convert or down sample the Q output of coupler 320 to obtain its output signal which is used to create the LSB and USB signals for both polarizations V and H.

An adder 360 is configured to add the third mixer output signal and the fourth mixer output signal to create an adder output signal I/USB 361.

A differencer 370 is configured to subtract the third mixer output signal from the fourth mixer output signal to create a differencer output signal Q/LSB 371.

Output signals 361 and 371 are inputs to a second set of I/Q down converters (e.g., fifth mixers 363, 367, and sixth mixers 373 and 377) and local oscillators with I or Q phase signal inputs to those mixers of the second set of down converters.

The second set of down converters includes mixer 363 configured to mix the adder output signal I/USB 361 with a unique $LO_Q$ signal 365 located at a frequency of wif1+wif2, to create an $H_Q$ output signal that is output to $H_Q$ output port 366. The second set of down converters includes mixer 367 configured to mix the adder output signal I/USB 361 with a $LO_I$ signal 368 to create a $V_Q$ output signal that is output to $V_Q$ output port 369.

The second set of down converters includes mixer 373 configured to mix the adder output signal Q/LSB 371 with a $LO_Q$ signal 375, such as from $LO_Q$ signal generator or port 362, to create an $H_I$ output signal that is output to $H_I$ output port 376. The second set of down converters includes mixer 377 configured to mix the adder output signal Q/LSB 371 with a $LO_I$ signal 378, such as from $LO_I$ signal generator or port 372, to create a $V_I$ output signal that is output to $V_I$ output port 379.

The $LO_I$ and $LO_Q$ signals at mixers 363, 367, 373 and 378 (e.g., from $LO_I$ and $LO_Q$ signal generators 365, 368, 375 and 378) are each at a different frequency than the LO at mixers 340 and 350. To summarize the frequencies for the LOs, if the LOin frequency is called fLO. The LO signal used to drive mixer 322 and 324 is at frequency 4fLO. Therefore, the first IF frequency fIF1 is located at frequency |fRF−4fLO|. The second mixer (340) is mixed with frequency fLO/4 and the second IF frequency is the sum (not the difference) of this and fIF1. Therefore, the second IF frequency is fIF2=fIF1+fLO/4. To get to baseband at the output of mixer 363, the LO frequency of the mixer 363 is located at frequency fIF2=fRF−4FLO+fLO/4=fRF−15fLO/4.

In some cases, receiver 300 improves the receiving, demodulating and signal processing of the N1 RF input signal of receiver 200 by receiving, demodulating and signal processing two different or dual-polarization (V, H) rotation RF signals, such as of the N1 RF input signal. A first part of the improvement of receiver 300 over receiver 200 is inputting the dual-polarization (V, H) signals to the IN and ISO inputs of coupler 320 for demodulating and signal processing. Another part of this improvement is adding a 90 degree phase shifter 380 to create a 90 degree phase shifted signal version of the LO frequency signal output (e.g., $\sin(\omega_{IF}t)$) to be added to the local oscillator with LO I phase added to the LO input of the fourth mixer. A third of this improvement is adding local oscillators with I or Q phases to the LO input of the third and fourth mixers. A fourth part of this adding a second set of I/Q down converters (e.g., fifth and sixth mixers) and local oscillators with I or Q phases to those mixers of the second set of down converters.

It is considered that receiver 300 is capable of simultaneously receiving, demodulating and deciphering data of two different RF polarized signals by receiving one polarization (e.g., an H polarization) into the IN RF port and the other polarization (e.g., a V polarization) into the "isolated" ISO RF port of a hybrid coupler 320. It is considered that from the 0 degree output of coupler 320 to mixers 363 and 367 is the I path of 0 degrees I signal, and that from the 90 degree output of coupler 320 to mixers 373 and 377 is the Q path of 90 degrees I signal. Thus, receiver 300 is a single image-selection receiver architecture that can recover dual-polarized RF signals with either the USB (81-86 GHz) band or the LSB (71-76 GHz) band frequencies to simultaneously receive and extract the desired information from them and convert it into a usable form. The concept of receiver 300 can be used to design dual-polarization radio frequency (RF) receivers for various other dual-polarization and LSB or USB frequency bands.

FIGS. 3B and 3C show a simultaneous dual polarization operating theory 398 and 399 for an RF receiver such as receiver 300 using the variables identified for FIGS. 2A and

3A. FIG. 3C shows how polarizations are separable at theory 399 for receiver 300 using the variables identified for FIGS. 2A and 3A. This theory 398 and separation 399 show that receiver 300 is a dual-polarization and single image-selection receiver architecture that can simultaneously recover both dual-polarization H and V signals, each simultaneously having both the USB (81-86 GHz) band and LSB (71-76 GHz) band frequencies by including the dual-polarization architecture and the two summing I and Q paths and taking the sum and different of the I/Q paths.

In some cases, receiver 300 is part of a transceiver, and can receive as noted, as well as transmit the RF signals from port 410 based on receiving and having the H and V polarization signals received at ports 366, 369, 376 and 379. For transmitting, there may be first and second data signals having the V,H polarization and/or USB/LSB bands to be converted to RF signals for transmission at port 310 and or 311. Transmitting here may include up-converting the $H_Q$ from port 366 and the $V_Q$ signal from port 369 at mixers 363 and 367. Transmitting here may include up-converting the $H_I$ from port 376 and the $V_I$ signal from port 379 at mixers 373 and 377. Transmitting may include add splitting the V,H Q signals (and/or I/USB input) at adder 360 and difference splitting the V,H I signals (and/or Q/LSB input) at differencer 370. Transmitting here may include combining, using a local oscillator (LO) frequency of an LO 330 and a plurality of summing paths, (e.g., paths 342-340 and 352-350) the H and V polarization signals received at ports 366, 369, 376 and 379 to provide an image (IM) band and an RF band, such as coupled by the 0 degree and 90 degree ports of coupler 320 and output from the IN port and the ISO port, then transmitted from RF ports 310 and 311, respectively. Transmitting may then include up converting the IM band and the RF band to provide an RF signal using the LO 330, the LO frequency phase shifted 90 degrees for one mixer 350 (e.g., and optionally being between a USB frequency and an LSB frequency), such as converting the RF band at mixers 340 and 322; and converting the IM band at mixers 350 and 324 before they go to the 0 degree and 90 degree ports of coupler 320. Transmitting may then include transmitting the RF signals from RF ports 310 and 311 including the H and V polarization signals output from IN port and ISO port of coupler 320, respectively.

Figure 4A:
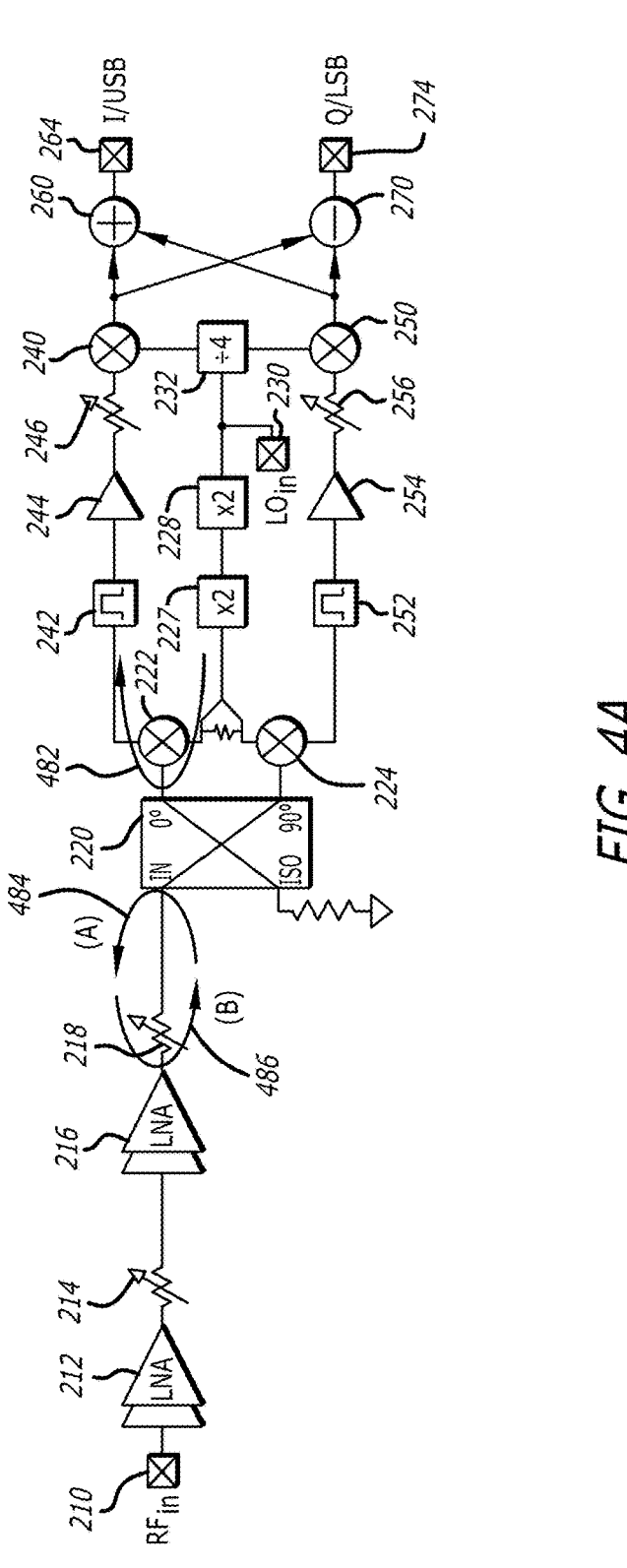
FIG. 4A shows circuit diagram of an RF receiver having a local oscillator (LO) Leakage signal that can be canceled or reduced.

FIG. 4A shows circuit diagram of a receiver 400, such as a receiver herein, having local oscillator (LO) leakage signal 482 that can be canceled or reduced using LO leakage cancellation shown herein. FIG. 4A shows that LO leakage signal 482 leaks into the RF path as leakage signal 484 between the attenuator 218 and RF IN input port of coupler 220. Signal 482 may be a leakage signal of −20 dBm at input to the mixer 222 and might be leakage signal 484 of −20 dBm after leaking through mixer 222 into the hybrid coupler 220.

LO leakage signal 484 reflects off the (output of) LNA 216 and back into the hybrid coupler 220 and RF IN input port and from there back to mixer 222 as shown by the upper curve and arrow of signal 482. Signal 486 may experience a 10 dB return loss due to the reflection meaning the signal 486 returns at −30 dBm to RF IN input port of coupler 220 as shown by the lower curve of signal 486 and 484. This leakage input to RF IN input port of coupler 220 is a LO signal that is now is mixed down with itself (e.g., from multiplier 227 from LO 230) by coupler 220 and mixer 222 to DC voltage creating a DC voltage offset output from mixer 222 to filter 242. This DC voltage can be rejected in a bandpass filter (e.g., filter 242) but still might compress the LNA signal from LNA 216 causing undesired loss of RF frequency band input to input RF IN port of coupler 220 and/or other undesired loss of performance of the receiver.

The LO leakage also reaches the ISO port of the coupler 220 or 320. The LO leakage may be isolated from the input but not from the 0/90 degree ports of the coupler 220 or 320.

Figure 4B:
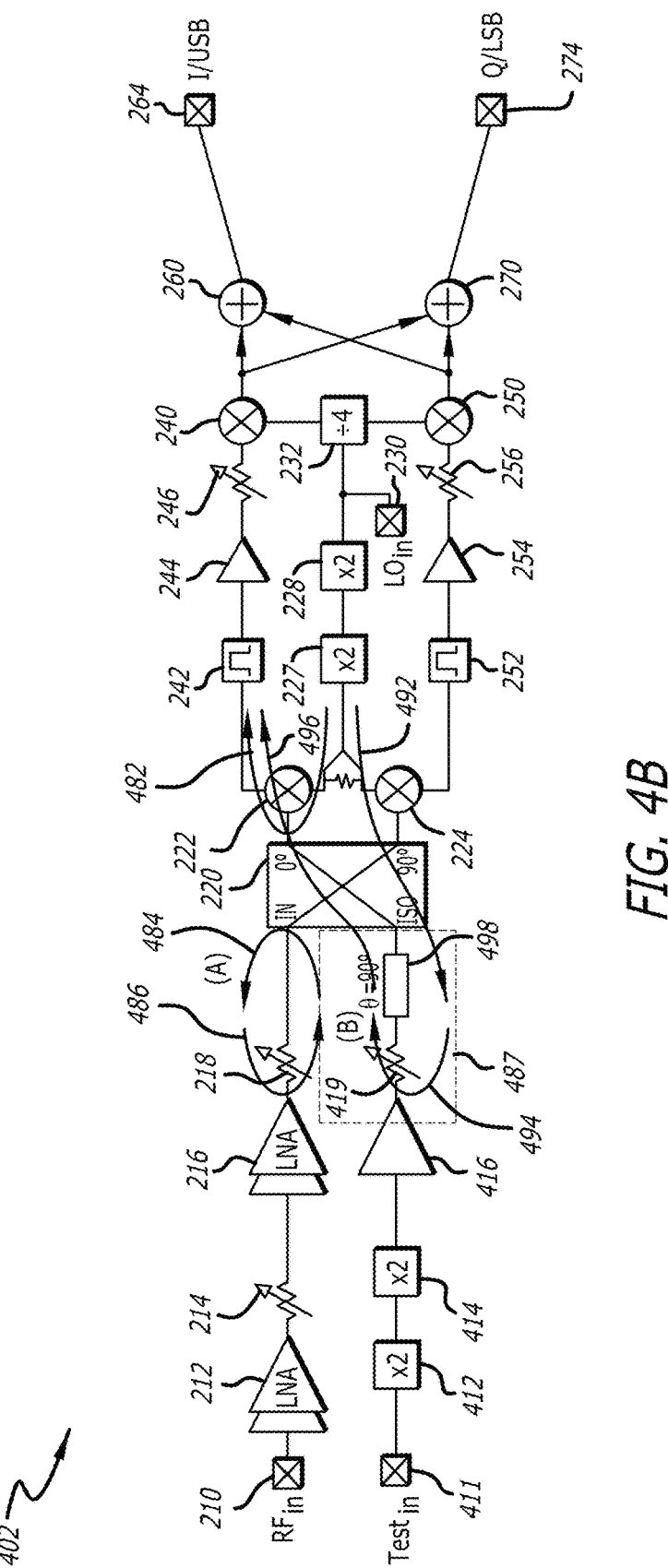
FIG. 4B shows circuit diagram of an RF receiver having two local oscillator (LO) Leakage signals that can be canceled or reduced.

FIG. 4B shows circuit diagram of a receiver 402, such as a receiver herein, having local oscillator (LO) leakage signal 492 that can be canceled or reduced using LO leakage cancellation shown herein. FIG. 4B shows that LO leakage signal 492 leaks into the RF path between the attenuator 419 and RF IN input port of coupler 220. Signal 492 may be a leakage signal of 10 dBm at input to the mixer 224 and might be leakage signal 494 OR 496 of −30 dBm after leaking through mixer 224 into the hybrid coupler 220.

LO leakage signal 494 reflects off the LNA 416 and back into the hybrid coupler 220 and RF ISO input port and from there back to mixer 222 as shown by the upper curve and arrow of signal 496. Signal 494 may experience a 10 dB return loss due to the reflection meaning the signal 496 returns at −30 dBm to RF ISO input port of coupler 220 as shown by the upper curve of signal 494 and 496. This leakage input to RF ISO input port of coupler 220 is a LO signal that is now is mixed down with itself (e.g., from multiplier 227 from LO 230) by coupler 220 and mixer 222 to DC voltage creating a DC voltage offset output from mixer 222 to filter 242. This DC voltage can be rejected in a bandpass filter (e.g., filter 242) but still might compress the LNA signal from LNA 416 causing undesired loss of RF frequency band input to input RF IN port of coupler 220 and/or other undesired loss of performance of the receiver.

Each of the undesired, reflected LO leakage signals 482 and 492 that leak back into the mixer 222 and are DC voltage in the mixer output (e.g., shown in FIGS. 4A-C) can also be leaked into the mixer 224 and be mixed down to DC voltage at the mixer 224 output.

In some cases, attenuator 419 is attenuator 219. In this case LNA 416 is LNA 217.

Beneficial and increased image rejection in an RF receiver can be accomplished by being able to tune the amplitude and phase the received signal being signal processed by the receiver in two channels such as that the amplitude and phase of the signals in the two paths behave identically.

For example, 90-degree phase shifter 498 creates and outputs a 90 degree phase shifted signal version of the input signal it receives from a reflection of leakage 482 and/or 492 by LNA 416 (through attenuator 419). In some cases, 90-degree phase shifter 498 creates and outputs a 90 degree phase shifted signal version of the LO leakage signal from the RF ISO input port of the hybrid coupler (e.g., LO leakage signal 492).

Figure 4C:
FIG. 4C shows local oscillator (LO) leakage cancellation theory for an RF Receiver.

FIG. 4C shows local oscillator (LO) leakage cancellation theory 404 for an RF Receiver, such as a receiver herein, using the variables identified for FIGS. 2A-4B. FIG. 4C shows how adding a 90-degree (approximately 90-degrees) phase shifter 498 and adjustable attenuator 419 in the isolated path (e.g., the path that inputs to RF ISO port of the coupler) allows cancellation of the LO leakage signals, such as resulting from signals 482 and 492.

FIG. 4C shows a computer simulation of theory 404 using mismatched generic loads 401 to represent the (output of) LNA 416; tuned transmission line 403 to represent the 90-degree phase shifter 403 in combination with and adjustable attenuator 419; hybrid coupler 420 to represent a receiver coupler herein; s-parameter power splitter 405 to represent how power incident from port 407 is split through the mixers into the hybrid 420 and then the reflected power is combined through 405 and delivered to termination 407;

and termination 407 to represent a leakage detector/detection. In this simulation, port 407 is both the source of energy and the termination of the energy. The LO power is generated at port 407 and split to drive the mixers.

FIG. 4C also shows graph 409 having amplitude (vertical axis in dB) and frequency (horizontal axis in GHz) and plotting an ADS output signal for the simulation. The down pointing arrow of graph 409 shows that LO Leakage is eliminated for the frequency that the transmission line is tuned to, e.g., 78-79 GHz.

Figure 5:
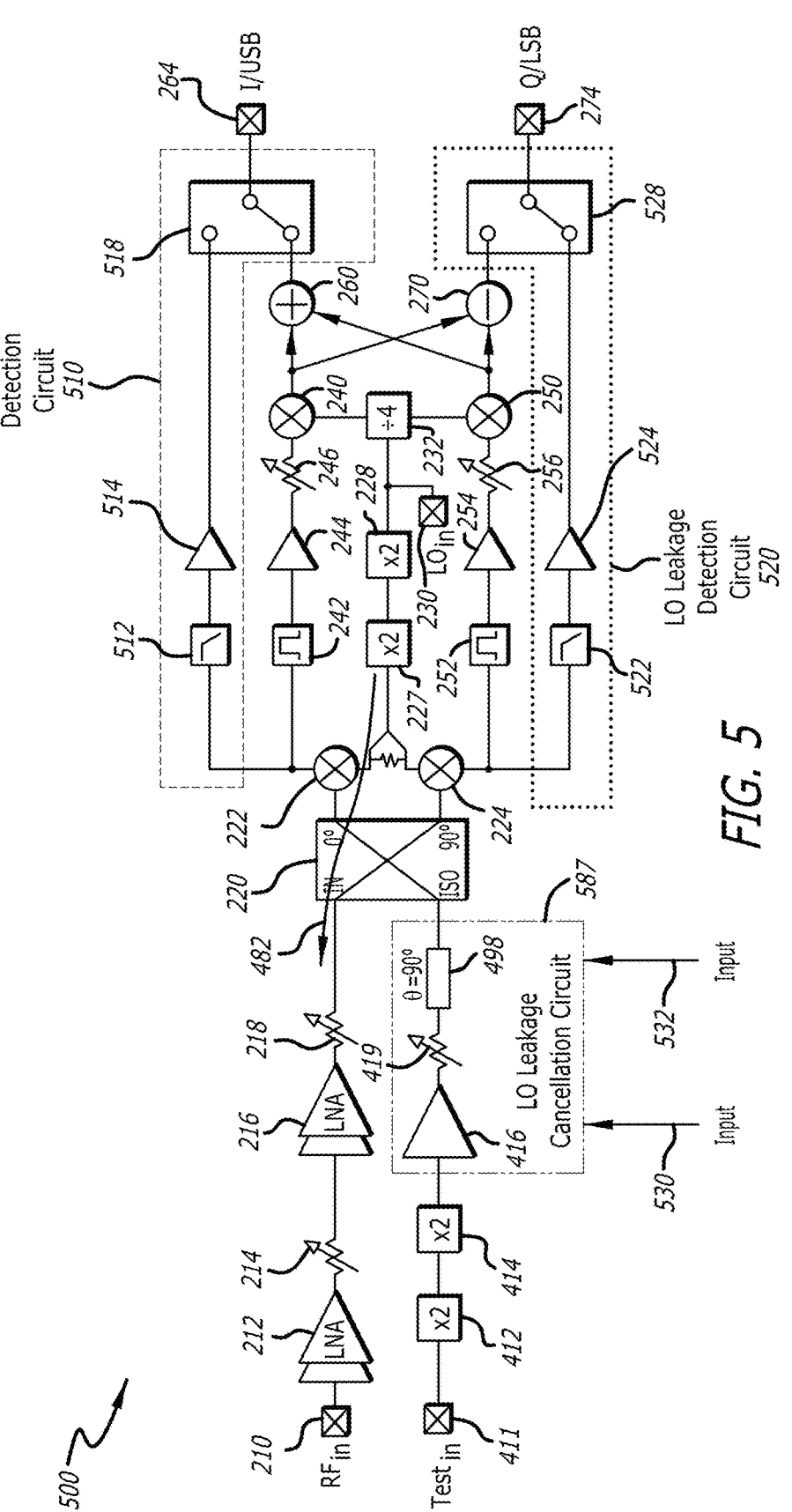
FIG. 5 shows circuit diagram of an RF receiver that can also cancel LO leakage through a tunable passive network.

FIG. 5 shows circuit diagram of a receiver 500, such as a receiver herein, that can also cancel LO leakage through a tunable passive network on an RF hybrid coupler, such as by tuning out LO leakage and phase band signals. Receiver 500 may include the image selection I/Q receiver of FIGS. 2 and/or 3 that can also reduce or cancel LO leakage through a tunable passive network on an RF hybrid coupler, such as by tuning out LO leakage and phase band signals using LO leakage cancellation circuit 487.

The LO leakage cancellation circuit 587 (and detectors 510/520 of FIG. 5) senses inherent LO leakage through the pair of mixers (222 and 224) and propagates through the hybrid to the IN and ISO ports (e.g., as LO leakage signals 484 and 492). Based on the cancellation circuit produced by 498, 419, and 486, the signals reflected off the LNA (e.g., LNAs 216 and 416) are re-introduced to the mixers (222 and 224) and mixed with the LO signal (e.g., from LO 230). As the frequency at the RF port 210 and LO port 230 are the same, the signal at the IF falls to DC. Measuring the voltage a DC (e.g., see FIG. 5 circuits 510 and 520) determines how effective the cancellation is that is introduced by shifter 498. Perfect cancellation suggests that no DC voltage is produced at the output of 222 and 224 (e.g., and thus not detected as DC by FIG. 5 circuits 510 and 520). Otherwise, the amplitudes can be varied through attenuator 419 and/or 486, or the phase shift might be adjusted through shifter 498. To implement this detection scheme a DC receiver (e.g., see FIG. 5 circuits 510 and 520) is introduced in 402 to sense the LO leakage.

As noted, each of the undesired, reflected LO leakage signals 482 and 492 leak back into the mixer 222 and are mixed down to DC voltage at the mixer 222 output. This leakage and resulting DC voltage mixer output (e.g., shown in FIGS. 4A-C) also occurs at mixer 224. Thus, the reflected LO signal leaks, output by the mixers as DC voltage, can be measured by first and second LO leakage detectors 510 and 520 to adjust the transmission line phase using the 90-degree shifter 498 and the characteristic impedance using attenuator 419 (and optionally LNA 416) if and as needed to remove and/or reduce any leakage signals 486 and 496 reflected back to the RF IN input and/or RF ISO inputs of the hybrid coupler (e.g., coupler 220 and/or 320).

Consequently, a LO leakage cancellation circuit 487 may be formed using shifter 498 and attenuator 419 to tune out (or equalize) the any leakage signals 486 and 496 reflected back to the RF IN input and/or RF ISO inputs. Shifter 498 may be a 90 degree phase shifter to create a 180 degree phase shifted signal version of the LO 230 frequency signal output, the total phase occurring through due to the travel through the mixer (e.g., mixer 222 or 224) and back. This phase shift might also occur through the hybrid coupler 220. This version may have 4× the frequency of the LO 230 due to LO 230 output going through the set of ×2 multipliers, 227 and 228.

First LO leakage detector circuit 510 is coupled between the outputs of the first mixer 222 and output port 264. LO leakage detector circuit 510 is to provide the LO leakage cancelation circuit 487 with a LO leakage detection output signal 530. This output signal 530 may be reflected by amplifier 416 and attenuator 419 controls the amplitude of an input signal to the 90 degree phase shifter 498 which outputs the reflected, attenuated and 90 degree shifted phase version of that input signal 530 to the RF ISO input of the coupler.

LO leakage detector circuit 510 couples output of the first mixer 222 through a lowpass filter 512 (which passes the DC voltage reflected from leakage signals 482 and 492 as described in FIG. 4A-4C) and an amplifier 514 outputting the LO leakage detection output signal 530. The first switch 518 is to select an output between the first input and the second input, such as to select the first input to output an output of the first detection adder 260 having one of the V or H polarization and LSB or USB signals or the second input to output and output of the LO leakage detection output signal 530.

Second LO leakage detector circuit 520 is coupled between the outputs of the second mixer 224 and output port 274. LO leakage detector circuit 520 is to provide the LO leakage cancelation circuit 487 with a LO leakage detection output signal 532. This output signal 532 may be reflected by amplifier 416 and attenuator 419 controls the amplitude of an input signal to the 90 degree phase shifter 498 which outputs the reflected, attenuated and 90 degree shifted phase version of that input signal 532 to the RF ISO input of the coupler.

LO leakage detector circuit 520 couples output of the second mixer 224 through a lowpass filter 522 (which passes the DC voltage reflected from leakage signals 482 and 492 as described in FIG. 4A-4C) and an amplifier 524 outputting the LO leakage detection output signal 532. The second switch 528 is to select an output between the first input and the second input, such as to select the first input to output an output of the second detection adder 270 having one of the V or H polarization and LSB or USB signals or the second input to output and output of the LO leakage detection output signal 532.

The descriptions herein also allow for the use of image selection architecture to perform self test and calibration. Receiver 500 allows use of different Test IN input signal at port 411 to perform self-test and calibration (e.g., tuning) of the receiver to reduce or remove LO leakage (e.g., as noted in FIGS. 4A-5) for V and H polarized, as well as LSB and USB band input signals to the receiver.

In some cases, receiver 500 is part of a transceiver, and can receive as noted, as well as transmit the RF signals from port 210 based on receiving and having the LSB and USB signals received at ports 264 and 274, respectively. Transmitting here may be similar to transmitting for FIG. 2A.

Figure 6:
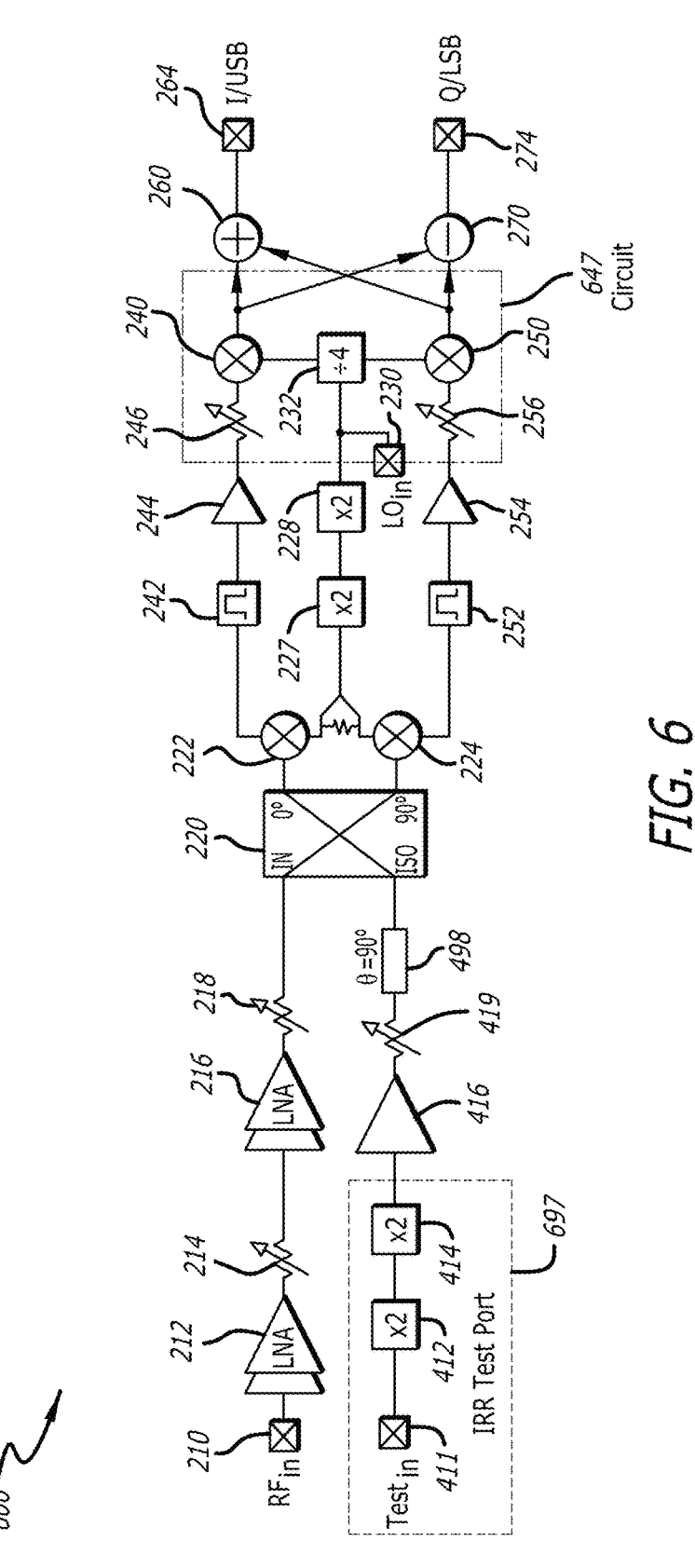
FIG. 6 shows self test and calibration circuit, or receiver, that can adjust amplitude and phase imbalance by using a test input.

FIG. 6 shows self test and calibration circuit 600 (e.g., an RF receiver), such as for an image selection I/Q receiver of FIGS. 2-5, that can also adjust amplitude and phase imbalance by using a test input at Test$_{IN}$ port 411 to inject the isolated ISO port of the hybrid coupler port and vice versa (e.g., the IN port) to sense and eliminate the undesirable image components. An IRR test port circuit 697 includes Test$_{IN}$ port 411; comprising two ×2 multipliers 412 and 414 that take a low frequency test signal and multiply this up to provide an input test type signal to amplifier 416 and/or circuit 587 to test LO leakage using detector 510 and/or 520.

For circuit 600, a LO leakage cancelation circuit 587 may be formed by using LNA 416, attenuator 419 and shifter 498 to tune out (or equalize) the any leakage signals 486, 496 and 497 reflected back to the RF IN input and/or RF ISO inputs during operation based on the response/control signal 530 and/or 532 (e.g., used to set or tune the signal output by the LNA and/or attenuator) from a LO leakage detection circuit 510 or 520 in response to a test signal input to Test$_{IN}$ port 411.

For instance, a Test IN input signal (e.g., having a tone of RF amplitude a single LSB signal frequency) may be input at port 411 (e.g., having a V and/or H polarized signal) having an LSB (e.g., processed in path Q having mixers 224 and 250 and port 274) band input signal to perform self-test and calibration to reduce or remove (USB) LO leakage based on a detection signal 530 from circuit 510 at or in the USB path (e.g., processed in path I having mixers 222 and 240, switch 518 and port 264).

In another instance, a Test IN input signal (e.g., having a tone of an USB signal frequency) may be input at port 411 (e.g., having a V and/or H polarized signal) having an USB (e.g., processed in path I having mixers 222 and 240 and port 264) band input signal to perform self-test and calibration to reduce or remove (LSB) LO leakage based on a detection signal 532 from circuit 520 at or in the LSB path (e.g., processed in path Q having mixers 224 and 250, switch 528 and port 274).

Here, LNA 416 may be a LO leakage amplifier and attenuator 419 is an amplitude tuning attenuator coupled between the Test$_{IN}$ input port (through the set of ×2 doublers or multipliers) to send an amplified version of a ×2×2 multiplied Test signal from the Test$_{IN}$ port to the 90 degree phase shifter 498. In these cases, shifter 498 is a 90 degree phase shifter to create a 90 degree phase shifted signal version of a signal received from Test input Test$_{IN}$ port 411 after going through the set of ×2 frequency multipliers 412 and 414; then LNA 416; then attenuator 419. Here, LNA 416 may be part of circuit 587 by adjusting the amplitude of the signal from the multipliers 412 and 414.

Receiver 500 and/or 600 may shift to an image-selection architecture that expands operation of the LO leakage cancelation circuits and LO leakage detection circuitry to both USB (81-86 GHz) and LSB (71-76 GHz). Receiver 500 and/or 600 may offer several advantages over current approaches to correct receiver imperfections (e.g., regarding LO leakage cancelation) and still have a gain compressing feature (e.g., by reducing the LO leakage into the LNAs 216, 316, 317 and/or 416).

By sensing the LSB "test" signal in the USB path receiver 500 and/or 600 allow for calibration of the I and Q paths amplitude and phase imbalance (e.g., using an embodiment of circuit 587) to reduce or remove undesired LO leakage. Adjusting the amplitude the phase imbalance advantageously improves the image rejection ratio (IRR) of the receiver. The gain and phase calibration can be performed through an attenuation in the I and Q path (e.g., using an embodiment of circuit 587).

In some cases, receiver 600 is part of a transceiver, and can receive as noted, as well as transmit the RF signals from port 210 based on receiving and having the LSB and USB signals received at ports 264 and 274, respectively. Transmitting here may be similar to transmitting for FIG. 2A.

In addition to the gain and phase calibration, the phase can be calibrated through a fine tuning adjustment in phase shift of the LO/4 signal output by divider 232 or 332 to mixers 240 and 250 (or 340 and 350) in the second mixing stage by a gain/phase compensation circuit 647. This phase tuning is typically only around +/−5 degrees. In this case, circuit 647 includes attenuators 246 and 256 to adjust the amplitude of the inputs from those attenuators to mixers 240 and 250, and mixers 240 and 250 adjust the frequency of the input from divider 232 to mixers 240 and 250. Together, these attenuators and mixers adjust gain and frequency of the output of the mixers 240 and 250, such as based on the control signals from detectors 530 and 532 to reduce or cancel LO leakage.

That is, a Test IN input signal (e.g., having a tone of an LSB signal frequency to test the amplitude and phase of I or Q signal path) may be input at port 411. The Test IN might be located in the LSB to test how much LSB signal leaks into the USB port. The LSB should be rejected at the USB port. By sensing the LSB test power that arrives at the USB and LSB path, a comparison can be performed to test and produce phase calibration to reduce or remove image contamination occurring from the LSB leaking into the USB. That control signal may change a phase shift of the LO/4 signal output by divider 232 or 332 which reduces or cancels a phase shift caused by LO leakage into mixers 222 and/or 224. In some cases, that control signal may change a phase shift of the LO/4 signal output by mixers 240 and 250 (or 340 and 350) which reduces or cancels a phase shift caused by LO leakage into mixers 222 and/or 224.

The Test$_{IN}$ input port may be an IRR test port coupled to the RF ISO input port through a set of doublers/multipliers ×2 and the LO leakage cancelation circuit 587. The Test$_{IN}$ input port may be configured to receive a Tone signal at the LSB and/or USB frequencies to test the LO leakage detection and LO leakage cancelation circuits. A tone signal may be an amplitude spike at one frequency or across a selected range of frequencies within the range of the LSB and/or USB. A threshold for the LO leakage may be below the acceptable or ideal thresholds of IRR shown for FIG. 1C. Thus, based on signal 530 and/or 532, the cancellation circuits (e.g., circuit 587) may adjust or tune out the LO leakage as needed to achieve either of these thresholds as desired. The concepts of receivers 500 and/or 600 can be used to design dual-band radio frequency (RF) receivers for various other LSB and USB frequency bands having other LO leakage cancellation for LO having different frequencies or other frequency leakage cancellation as described herein.

Heterogeneous integration of the receiver using a chiplet in or on a wafer technique allows the simultaneous integration of two or more device technologies onto the same low-loss interposer or wafer. Thus, for example the RF components and circuits on the left (e.g., input) side of the receiver (e.g., receiver, transmitter or transceiver), before and possibly including the coupler, can be located on a higher quality semiconductor chiplet or chiplets (e.g., of InP) while the non-RF components and circuits on the right (e.g., output) side of the receiver, after and possibly including the coupler, can be located on a lower quality semiconductor wafer (e.g., silicon). Here, the different device technologies provide benefits to sensitivity (low noise figure) due to the addition of the higher quality semiconductor chiplets. Here, incorporation of CMOS into the interposer or wafer is used for monitoring the gain and phase imbalances to achieve high image rejection ratio, such as by including detectors 510 and 520 in the lower quality semiconductor wafer.

Descriptions herein include heterogeneous integration of the dual-polarization and dual-band radio frequency (RF) receivers (e.g., receivers, transmitters and/or transceivers) with leakage and image rejection calibration noted above. In some cases, the electronic receiver (e.g., receiver, transmitter or transceiver) herein is disposed and/or fabricated on at least one of a wafer or at least one radio frequencies (RF) transistor chip (e.g., chiplet) of an assembly having heterogeneous integration of the chiplets in the wafer. In this case, the host wafer has a first circuit including passive devices; each at least one chiplet has a second circuit including at least one radio frequency (RF) transistor to output the RF signals; and electrical interconnects between the chiplet and the wafer electrical interconnects electrically connect the first circuit to the second circuit. In addition, a dielectric bonding material is between side surfaces of the chiplets and inside surfaces of cavities through the wafer.

The host wafer can have pre-fabricated interconnects and integrated circuitry, such as passive components, that connect to a chiplet level microelectronics transistor chip integrated in a through-wafer cavity of the wafer. This may form an assembly for integrated circuit devices where the chips contain active circuits from at least one semiconductor technology and the wafers contain passive (or active) circuits from another semiconductor technology (often a cheaper and larger scale technology). Using a low-cost large-diameter integration platform for the chips with active devices allows for much faster manufacturing of the assembled circuits, at larger scale and lower cost.

The electronic assembled circuit may integrate chiplets having one type of components into a carrier wafer having a different type of components. The electronic assembled circuit may integrate chiplets having high-performance integrated circuits, such as Indium Phosphorus (InP), Gallium Nitride (GaN) radio frequency (RF) integrated circuits (ICs) into host wafers having other integrated circuits, such as silicon-based integrated circuits, in a manner that is inexpensive and has high manufacturing yields and short manufacturing cycles. The high performance RF ICs, chips (or chiplets) can have type III-V transistors or other types of transistors and passive circuitry or components, and can be integrated together with resistors, inductors, capacitors and matching networks, as well as active devices from another semiconductor technology into the host wafer. For example, the RF ICs or chiplets can be one type of semiconductor technology formed in a first type of semiconductor material (e.g., Si) that is integrated together with resistors, inductors, capacitors, matching networks, active devices from another semiconductor technology formed in a different second type of semiconductor material (e.g., InP) and that are part of the host wafer by being disposed in cavities formed in the wafer.

A chiplet may be a chip including the circuitry, material, and/or devices noted herein. It may also be a chip or small chip having active (i.e., transistor) microelectronic devices, active CMOS devices, active microwave IC devices and/or active radio frequency (RF) IC devices. It may also be a chip or small chip having a surface acoustic wave (SAW), bulk acoustic wave (BAW) or other acoustic wave device. A chiplet may have a footprint or top surface area that is half, a third, a fifth or less than a fifth of that of a computer processor chip (e.g., 8086, P3, P4, etc.). Active devices may include active electronic components and/or active electronic circuits.

Figure 7:
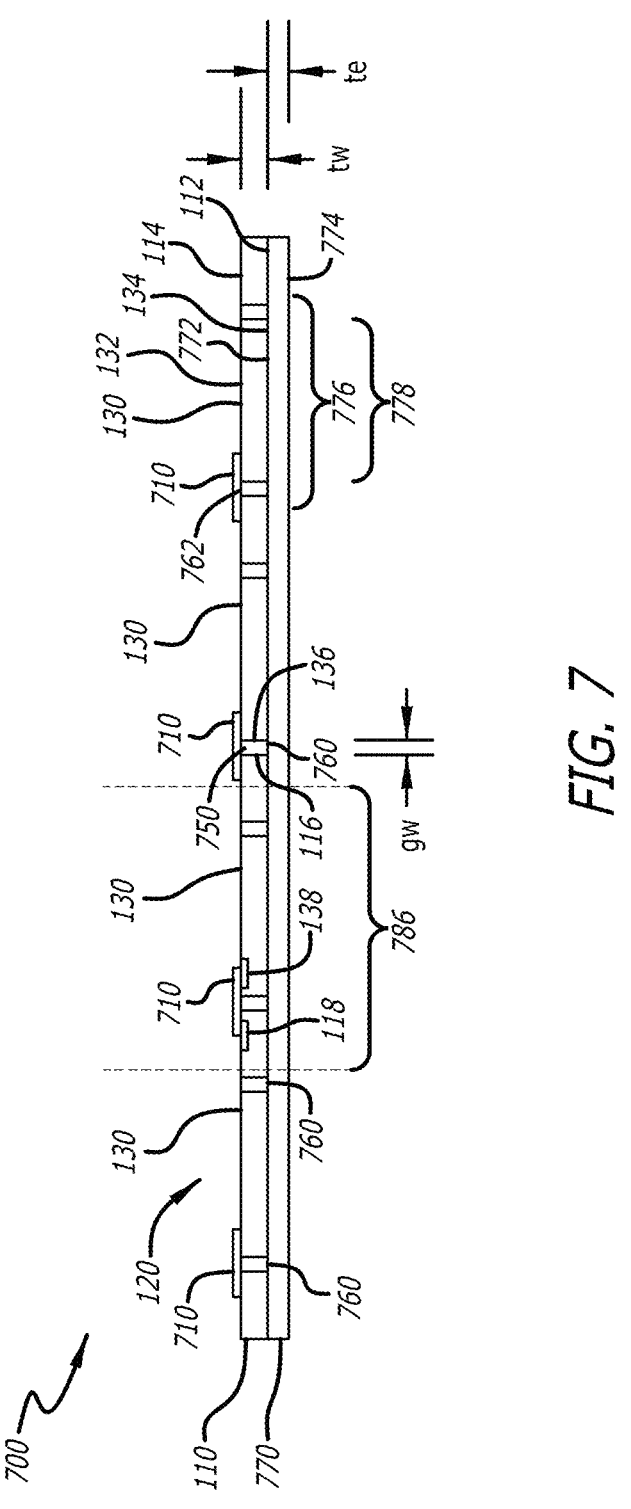
FIG. 7 is a schematic cross-sectional view of an electronic assembly device having in-substrate chiplet integration into wafer cavities of a host wafer.

FIG. 7 is a schematic cross-sectional view of an electronic assembly device 700 having in-substrate chiplets 130 integrated into wafer cavities 120 of a host wafer 110 using lateral dielectric material 360. Device 700 shows heterogeneous integration of chiplet 130 in a wafer 110. Host wafer 110 may be for heterogeneous integration of radio frequencies (RF) transistor chiplets. Host wafer 110 has back surface 112 and front surface 114. Host wafer 110 and/or each cavity 120 has side surfaces 116, such as a vertical or sidewall surfaces between the back surface 112 and front surface 114. There may be 3, 4 or more side surface 116. Typically, there are 4 side surfaces.

The RF components and circuits on the left (e.g., input) side of a receiver (e.g., receiver, transmitter or transceiver), before and possibly including the coupler, can be located on one or more higher quality semiconductor chiplets 130 (e.g., of InP) while the non-RF components and circuits on the right (e.g., output) side of the receiver, after and possibly including the coupler, can be located on a lower quality semiconductor wafer 110 (e.g., silicon). The higher quality semiconductor chiplets 130 provide better sensitivity (e.g., low noise figure) which is desirable, especially for RF receivers; while CMOS technology can be incorporated in the wafer 110 for monitoring the gain and phase imbalances to achieve high image rejection ratio at a cheaper fabrication and device cost, such as by including detectors 510 and 520 in the lower quality semiconductor wafer 110. In other cases, all of the receiver circuitry (including ports) may be located on one or more chiplets; or may be located on the wafer.

Host wafer 110 may be or include (e.g., as a mixture of materials or as material layers) silicon, silicon germanium, silicon on insulator, gallium arsenide, indium phosphide, aluminum nitride, diamond, quartz, alumina. If the host wafer 110 only contains interconnections and passive components, it can be a dielectric such as quartz, alumina, or another ceramic. The host wafer 110 may have layers of one or more of these materials in the form of an oxide material, crystalline material and polycrystalline material and/or amorphous material. Host wafer 110 may include some or only passive components such as resistors, capacitors, inductors, through substrate vias, dielectric layers, and/or metal layers (e.g., signal traces or signal planes). Host wafer 110 may include at least one layer of silicon, silicon carbide (SiC), quartz, or another semiconductor wafer material.

Host wafer 110 may include areas to be diced into integrated circuits, each having passive integrated components (e.g., signal traces, interconnects and conductive vias, resistors, inductors and/or capacitors), a single transistor and/or a plurality of transistors. Silicon is an advantageous choice for host wafer 110, because it takes advantage of having a lower expense than other materials; and/or of known microelectronics fabrication processes and of scaling and manufacturing capabilities.

Radio frequencies (RF) transistor chiplets 130 have frontside 132 (e.g., a frontside surface) and backside 134 (e.g., a backside surface). Each chiplet 130 has side surfaces 136, such as a vertical or sidewall surfaces between the frontside surface 132 and backside 134. There may be 3, 4 or more side surface 136. Typically there are 4 side surfaces. The number of side surfaces 136 of each chiplet 130 may be the same as the number of surfaces 116 of the cavities in the host wafer 110.

Chiplets 130 may each be or include (e.g., as a mixture of materials or as material layers) silicon (Si), silicon germanium (SiGe), silicon-on-insulator, gallium arsenide (GaAs), indium phosphide (InP), aluminum nitride, quartz, alumina, gallium nitride (GaN). The chiplets 130 may have layers of one or more of these materials in the form of an oxide material, crystalline material and polycrystalline material and/or amorphous material. There may be different electrical component ones or types of chiplets 130 that are manufactured separately from each other. Chiplets 130 can include a GaN, InP or GaAs or any other industry-known electrical component and can be fabricated on a substrate such as Si, SiGe, InP, GaAs, Alumina, or diamond, or any other substrate known in the industry.

Chiplets 130 or types of chiplets 130 may include RF receivers (e.g., receiver, transmitter or transceiver) as noted herein; transistors used for or in those receivers; RF switches, transmit and/or receive circuits; power switches, amplifiers and circuits such as using GaAs, InP, GaN while the host wafer may include transistors such as Si CMOS transistors. The chiplet transistors may have smaller and more expensive electrical components than those of host wafer 110. There may be one, tens, hundreds, thousands or hundreds of thousands of chiplets 130 embedded in or on one host wafer 110. There may be between one and one hundred chiplets 130 embedded in one host wafer 110. Host wafer 110 may have more passive components, lower cost components, routing (e.g., traces, conductive vias and interconnections) than those of chiplets 130. Host wafer 110 may be fabricated using different microelectronic fabrication techniques or processes than used to fabricate chiplets 130.

Chiplets 130 and host wafer 110 can be made of different semiconductor materials. For example, wafer 110 can be a silicon wafer while chiplets 130 can be a type III-Nitride material component chip. Chiplets 130 may each be or include an integrated circuit having passive integrated components (e.g., signal traces, interconnects and conductive vias, resistors, inductors and/or capacitors), a single transistor and/or a plurality of transistors.

The chiplets 130, each include at least one of transistor circuitry and interconnects to contact pads on a frontside 132 of the chiplets 130. The chiplets 130 may be high-end pre-fabricated active device chiplets that are integrated into host wafer 110 through pick and place assembly on temporary wafer with an adhesive laminate or simply on an adhesive laminate.

Device 700 may be an electronic assembly having a backside capping layer 770 having a top surface 772 and a back surface 774. Device 700 has a host wafer 110 having back surface 112 and front surface 114, with the back surface 112 of the wafer bonded to the top surface 772 of a backside capping layer 770 except for cavities 120 in the wafer 110 formed over a plurality of areas 776 of the top surface 772. The cavities may extend from back surface 112, through the wafer and to front surface 114. The cavities have side surfaces 116. The back surface 112 of the wafer may be directly attached to and touching the top surface 772. The bond between the back surface 112 and the top surface 772 may be a covalent, chemical or atomic bond.

Chiplets 130 or a plurality of chips have a backside 134 and a frontside 132, with the backsides 134 of the chiplets 130 bonded directly to at least portion 778 of the plurality of areas 776 of the top surface 772 of the backside capping layer. Portion 778 may be the footprint of the chiplet 130 on top surface 772 within the cavity 120. A gap 750 between side surfaces 116 and 136 may be the difference between area 776 and portion 778. The backside 134 may be directly attached to and touching the top surface 772. The bond between the backside 134 and the top surface 772 may be a covalent, chemical or atomic bond.

The cavities 120 may be through-substrate holes or through substrate holes etched in the wafer at the areas 776. The, chiplets 130 may be embedded into the wafer 110 at the substrate holes or at cavities 120.

A lateral dielectric material 760 extends between side surfaces 136 of the chiplets 130 and the side surfaces 116 of the wafer or cavities. The lateral dielectric material 760 may mechano-chemically bond the side surfaces 136 of the chiplets 130 to the side surfaces 116 of the wafer. The lateral dielectric material 760 may form a mechanical and/or a chemical bond to the side surfaces 136 and to the side surfaces 116. In some cases, the lateral dielectric material 760 is a molded material and the bonding is a mechano-chemical bond.

Dielectric material 760 is not a metal and is an electrical insulator. Dielectric material 760 may be or include material that is not conductive, is not a semiconductor, is a plastic, is not an alloy, is a bio-material. Material 760 may be an epoxy. It may be epoxy with a silica particles. It may be epoxy with a SiO2 particles.

Material 760 may have dielectric characteristics such that when placed in an electric field, the electric charges do not flow through the material. Electric charges slightly shift from their average equilibrium positions, causing dielectric polarization that causes positive charges to flow in the direction of the field and negative charges to shift in the opposite direction of the field. This phenomenon yields an internal electric field, which in turn reduces the overall electric field within the dielectric material.

In some cases, material 760 may have no current flow through it when a voltage is applied. However, certain changes do happen at the atomic scale. When a voltage is applied across a dielectric object, it becomes polarized. Since atoms are made of a positively charged nucleus and negatively charged electrons, polarization is an effect which slightly shifts electrons towards the positive voltage. They do not travel far enough to create a current flow through the material—the shift is microscopic, but has a very important effect. Once the voltage source is removed from the material, it either returns to its original non-polarized state, or stays polarized if the molecular bonds in the material are weak. The dielectric materials may be an insulators, but one that is easily polarized.

The lateral dielectric material 760 is disposed in gaps 750 between the side surfaces 136 of each of the chiplets 130 and the side surfaces 116 of the corresponding wafer cavity that each chiplet 130 is disposed in. The gap 750 has a width gw of between ⅕ (one fifth) and 10 times a thickness tw of the wafer 110 or chiplets 130.

The thickness tw of the wafer may be between 20 and 200 microns. It may be between 50 and 125 um. It may be 75 um. The thickness of one, many or all of the chiplets may be that same as that of the wafer. A thickness the of the backside capping layer may be between 7 and 700 microns. It may be between 5 and 100 microns. It may be between 10 and 50 microns. It may be 15 um.

The backside capping layer 770 may be is a high-thermal-conductivity backside metallization layer that improves heat transfer from the chiplets 130 to the wafer 110. Layer 770 may be a thermal plane that improves heat conduction away from the chiplets by increasing thermal conduction from the chiplets 130 and to layer 770 and/or wafer 110. Layer 770 be a material in direct contact with the chiplets 130 to increase thermal conduction between the materials of the chiplets 130 and that of layer 770. In some cases, the backside capping layer 770 has a coefficient of thermal expansion between those of or equal to one of those of the wafer 110 and of the chiplets 130.

Interconnects 710 may be formed directly on the lateral dielectric material 760 and connect electrical (e.g., power, ground and/or signal) contacts 138 of the chiplets 130 to contacts 118 of the wafer 110. Interconnects 710 may include direct interconnect routing or traces that is formed directly on the lateral dielectric material (e.g., without any dielectric/air gap), and that extends from the chiplets to wafer electrical routing. The interconnect routing may include low loss high-performance DC, RF, and mm-wave routing from the chiplets 130, directly on the lateral dielectric material, and to wafer electrical routing. Interconnects 710 may be directly on material 760 by being bonded to and/or directly attached to (e.g., touching) the top surface of the lateral dielectric material 760.

In some cases, wafer 110 includes an electronic integrated circuit (not shown), at least one integrated circuit contact

118 (e.g., contact pad) formed on the front wafer surface 114, and at least one through-wafer cavity 120 having side surface 116 that join back surface 112 to front surface 114. In some cases, a chiplet 130 is held in the through-wafer cavity 120 by a lateral dielectric material 760 that attaches at least one side surface 116 of the through-wafer cavity 120 to at least one side surface 136 of the chiplet 130. In some cases, lateral dielectric material 760 fills gap 750 of the cavity, thus attaching most of the side surfaces 136 of chiplet 130 to the side surfaces 116 of through-wafer cavity 120; however material 760 does not attach the backside 134 of chiplet 130 to top surface 772 of layer 770.

It is noted that wafer 110 can include any integrated circuit, active or passive, made possible by a chosen manu-facturing process; for example, a CMOS manufacturing process. In some cases, the thickness of the one or more integrated circuit layers can for example be only a fraction of the thickness tw of wafer 110 (for example between ⅒ and ¹⁄₁₀₀₀ of the thickness of wafer 110; for example 50 nm thick with a wafer 50 μm thick). In some cases, the thickness of wafer 110 can be reduced after fabrication of integrated circuits of the wafer and for example before etching the through-wafer cavity 120 or after filling gap 750 with lateral dielectric material 760.

Chiplet 130 may include one or more transistors (not shown) having its terminals connected to at least one inte-grated circuit contact 138 (e.g., contact pad), such as by a conductive via (not shown). Chiplet 130 can comprise a substrate and integrated circuit layers formed on top of its substrate, the thickness of the integrated circuit layers being for example only a fraction of the thickness of the substrate (for example between ⅒ and ¹⁄₁₀₀₀ of the thickness of the substrate). In some cases, the total thickness of chiplet 130 is smaller than the total thickness of host wafer 110. In some cases, lateral dielectric material 760 contacts the side sur-faces 136 of chiplet 130 along most of their height (at least 50% of the height, starting from close to the top surface of chiplet 130). Lateral dielectric material 760 may contact essentially all of the side surfaces 136 of chiplet 130. Lateral dielectric material 760 may fill completely gap 750, up to a level essentially flush with the front surface 114 of host wafer 110.

It is considered that the host wafer 110 can be vertically diced at dicing lines (shown by the vertical bars in FIG. 2) along a perimeter 786 of the wafer around at least one chiplet to form a chip having the at least one chiplet and an area of the wafer surrounding the at least one chiplet.

Example Embodiments

The technologies described herein include single image selection I/Q transceivers, transmitters and/or receivers that can be used to simultaneously transmit and/or receive two different bands and/or polarized signals. The transceivers and/or receivers may be or be part of a dual-polarization and/or dual-band radio frequency (RF) receiver, such as a receiver to demodulate and decipher data in the LSB (71-76 GHz) and USB (81-86 GHz) bands and/or H and V polar-ization signals.

Examples of these technologies include a system (e.g., any of the transceivers, transmitters and/or receivers) for receiving or transmitting signals, including a radio fre-quency (RF) port (e.g., port 210; or 310 and 311; and optionally 411) configured to receive or transmit an RF signal including an upper side band (USB) and a lower side band (LSB). A first mixing stage (e.g., coupler 220 or 320; or mixer 222, 224, 322 and/or 324) is coupled with the RF port and configured to convert the image (IM) band and RF band through the 0 degree port from the coupler (e.g., I quadrature) and 90 degrees from the coupler (e.g., Q quadrature) (e.g., coupler 220 or 320). A band selection architecture (e.g., from mixer 222 and 224 to ports 264 and 274; or from mixer 322 and 324 to ports 366, 369, 376 and 379) is coupled with the first mixer (or mixing stage) and includes a second mixer (e.g., mixer 222 and/or 224; or mixer 322 and/or 324), the selection architecture configured to output or receive the USB and the LSB (e.g., at ports 264 and 274; or ports 366, 369, 376 and 379) based on the RF band and the IM band. When transmitting, this can be reversed to go from output ports to input port. In some cases, the first mixing stage is coupled with the RF port and configured to convert between the RF signal and an image (IM) band and an RF band through the 0 degree port from the coupler (e.g., I quadrature) and 90 degrees from the coupler (e.g., Q quadrature).

In the system, the selection architecture may further include summing paths (e.g., paths 242-240 and 252-250; or paths 342-350 and 352-350) coupled with the second mixer.

In the system, the first mixer (or mixing stage) may provide an in-phase band and a quadrature band (e.g., I quadrature or 0 degrees, and Q quadrature or 90 degrees band) corresponding to the RF band and the IM band; and the summing paths may include a sum path (e.g., path 222-260 or 322-360) for one of the USB or (e.g., path 224-270 or 324-370) for the LSB; and a difference path for another of the LSB or the USB.

In the system, the second mixer may include an in-phase band mixer (e.g., mixer 222 or 322); and a quadrature band mixer (e.g., mixer 224 or 324); where each of the sum path and the difference path is coupled with the in-phase band mixer and the quadrature band mixer.

The system may further include a local oscillator (LO) (e.g., LO 230 or 330) having an LO frequency and coupled with the first mixer (or mixing stage) and the second mixer, the LO frequency being between a USB frequency and an LSB frequency.

In the system, the first mixer (e.g., mixer 222 and 224; or 322 and 324) may down convert the USB and the LSB to an intermediate frequency (IF) band (e.g., at the output of mixer 222 and 224; or 322 and 324).

In the system, the RF port (e.g., ports 310 and 311; and optionally 411) may be configured to receive or transmit a plurality of polarizations, the plurality of polarizations being orthogonal; and the selection architecture may be configured to separately output or receive a first polarization and a second polarization (e.g., H and V polarizations) of the plurality of polarizations.

In the system, the selection architecture may further include down converters for separately providing the first polarization (e.g., H or V polarization) for the USB, the second polarization (e.g., the other of H or V polarization) for the USB, the first polarization (e.g., H or V polarization) for the LSB, and the second polarization (e.g., the other of H or V polarization) for the LSB. In some cases, an Hq and a Vq output for USB; and a Hi and a Vi output for LSB. In some cases, an Hq and Hi output for the H polarization input; and a Vi and Vq output for the V polarization input. When transmitting, this can be reversed to go from output ports to input ports.

The system may further include a phase shifter (e.g., shifter 498) coupled with the first mixer (e.g., 220 or 222/224) and the RF port (e.g., 210 or 411).

In the system, the first mixer (or mixing stage) may provide an in-phase band and a quadrature band (e.g., I quadrature or 0 degrees, and Q quadrature or 90 degrees band) and wherein the phase shifter is a ninety degree phase shifter (e.g., shifter 498).

In the system, the selection architecture may further include at least one plurality impedance (e.g., amplifier 416 and/or attenuator 419) configured for image rejection.

In the system, the RF port (e.g., 210; or 310 and 311; and optionally 411), the first mixer (or mixing stage), and the selection architecture may be included in a heterogeneous integrated device (e.g., device 700 having chiplets 130 in wafer 110). In this case, device 700 (e.g., chiplets 130 and/or wafer 110) may include any of receivers or transceivers 200-600). In this case, chiplets 130 and/or wafer 110 may include all or part of any of receivers or transceivers 200-600).

In the system, the heterogeneous integrated device (e.g., device 700) may include an interposer (e.g., wafer 110) configured to couple the RF port, the first mixer (or mixing stage), and the selection architecture, and the interposer (e.g., device 110) may further include complementary metal-oxide semiconductor (CMOS) devices (not shown in but described for FIG. 7).

In the system, the CMOS devices may be configured to monitor at least one of gain and phase imbalances for the system (e.g., using detector 510 and/or 520).

Examples of these technologies include an integrated heterogeneous device (e.g., device 700 having chiplets 130 in wafer 110) including a system (e.g., any of the transceivers, transmitters and/or receivers) configured to receive or transmit signals including a radio frequency (RF) port (e.g., port 210; or 310 and 311; and optionally 411). The system includes a first mixing stage (e.g., coupler 220 or 320; or mixer 222, 224, 322 and/or 324), and band selection architecture (e.g., from mixer 222 and 224 to ports 264 and 274; or from mixer 322 and 324 to ports 366, 369, 376 and 379). The RF port is configured to receive or transmit an RF signal including an upper side band (USB) and a lower side band (LSB). The first mixer (or mixing stage) is coupled with the RF port and is configured to convert an image (IM) band and an RF band through the 0 degree port from the coupler (e.g., I quadrature) and 90 degrees from the coupler (e.g., Q quadrature) (e.g., coupler 220 or 320). The selection architecture is coupled with the first mixer (or mixing stage) and includes a second mixer (e.g., mixer 222 and/or 224; or mixer 322 and/or 324). The selection architecture is configured to output or receive the USB and the LSB (e.g., from or to ports 264 and 274; or ports 366, 369, 376 and 379) based on the IM band and the RF band. The system includes an interposer (e.g., wafer 110) configured to electrically and mechanically couple the RF port, the first mixer (or mixing stage), and the selection architecture (e.g., to couple together any two or all 3 of the RF port, the first mixer (or mixing stage), and the selection architecture). In some cases, the first mixing stage is coupled with the RF port and configured to convert between the RF signal and an image (IM) band and an RF band through the 0 degree port from the coupler (e.g., I quadrature) and 90 degrees from the coupler (e.g., Q quadrature).

In the device, the system may further include a local oscillator (LO) (e.g., LO 230 or 330) having an LO frequency and coupled with the first mixer (or mixing stage) and the second mixer, the LO frequency being between a USB frequency and an LSB frequency.

In the device, the first mixer (or mixing stage) may provide an in-phase band and a quadrature band (e.g., I quadrature or 0 degrees, and Q quadrature or 90 degrees band) corresponding to the IM band and the RF band; and the selection architecture may include a sum path (e.g., path 222-260 or 322-360) coupled with the second mixer and a difference path (e.g., path 224-270 or 324-370) coupled with the second mixer, the sum path for one of the USB or the LSB and the difference path for another the LSB and the USB.

In the device, the RF port (e.g., ports 310 and 311; and optionally 411) may be configured to receive or transmit a plurality of polarizations (e.g., H and V polarizations); and the selection architecture may be configured to separately output or receive a first polarization and a second polarization (e.g., H and V polarizations) of the plurality of polarizations.

The device may further include a phase shifter (e.g., shifter 498) coupled with the first mixer (e.g., 220 or 222/224) and the RF port (e.g., 210 or 411).

In the device, the selection architecture may further include at least one plurality impedance (e.g., amplifier 416 and/or attenuator 419) configured for image rejection.

In the device, the interposer (e.g., wafer 110) may further include complementary metal-oxide semiconductor (CMOS) devices configured to monitor at least one of gain and phase imbalances for the system (e.g., using detector 510 and/or 520).

Examples of these technologies herein include an electronic receiver to I/Q demodulate a dual frequency band radio frequency (RF) input signal, the receiver including a hybrid coupler having a radio frequency (RF) IN input port, an RF ISO input port, an RF 0 degree I/Q output port and an RF 90 degree I/Q output port. The RF IN input port configured to receive a first RF 1 IN input signal including an upper side band (USB) signal and a lower side band (LSB) signal. The coupler configured to create an I/Q I signal at the RF 0 degree I/Q output port from the input signal received at the RF IN port and an input at the RF ISO input port. The receiver includes a local oscillator (LO) to output a LO frequency signal and a first mixer coupled to the RF 0 degree I/Q output port to mix the I/Q I signal with the LO frequency signal to create a first mixer output signal. The coupler is configured to create an I/Q Q signal at the RF 90 degree I/Q output port from the input signal received at the RF IN port and an input at the RF ISO input port. The receiver includes a second mixer coupled to the RF 90 degree I/Q output port to mix the I/Q Q signal with the LO frequency signal to create a second mixer output signal, The receiver includes a third mixer coupled to the output of the first mixer and to the LO to mix the first mixer output signal with the LO frequency signal output to create a third mixer output signal. The receiver includes a fourth mixer coupled to the output of the second mixer and to the LO to mix the first mixer output signal with the LO frequency signal output to create a fourth mixer output signal. There is an adder to add the third mixer output signal and the fourth mixer output signal to create an adder output signal I/USB; and a differencer to subtract the third mixer output signal from the fourth mixer output signal to create a differencer output signal Q/LSB.

In the receiver, the LO frequency signal may be coupled to the first mixer through a set of multipliers ×2 to create the first mixer output signal; the LO frequency signal may be coupled to the second mixer through the set of multipliers ×2 to create the second mixer output signal. The third mixer may be coupled to the output of the first mixer through a bandpass filter outputting a bandpass filtered signal to an amplifier and an amplitude tuning attenuator and to the LO through a frequency divider /4; and the fourth mixer may be coupled to the output of the second mixer through a bandpass filter outputting a bandpass filtered signal to an amplifier and an amplitude tuning attenuator and to the LO through the frequency divider /4.

The receiver may be to I/Q demodulate a dual-polarization signals; where the RF IN input port is configured to receive the first RF 1 IN input signal having an H-polarization first RF signal including the upper side band (USB) or the lower side band (LSB); and where the RF ISO input port is configured to receive a second RF 2 IN input signal having a V-polarization second RF signal including the upper side band (USB) or the lower side band (LSB). The receiver may further include a 90 degree phase shifter to create a 90 degree phase shifted signal version of the LO frequency signal output; a local oscillator I phase (LOi) signal generator to create a first LOi signal to be combined with the 90 degree phase shifted signal version of the LO frequency signal output, the first combined signal to be input into the fourth mixer which creates the fourth mixer output signal; a local oscillator Q phase (LOq) signal generator to create a first LOq signal to be combined with the LO frequency signal output, the second combined signal to be input into the third mixer which creates the third mixer output signal; a first set of down converters to mix the adder output signal I/USB with a second LOq signal to create an Hq output, and to mix the adder output signal I/USB with a second LOi signal to create a Vq output; and a second set of down converters to mix the differencer output signal Q/LSB with a third LOq signal to create an Hi output, and to mix the differencer output signal Q/LSB with a third LOi signal to create a Vi output.

In the receiver, the RF IN input port may be coupled through a first set of low noise amplifiers and amplitude tuning attenuators to one of an antennae or a radio frequency (RF) port; and the RF ISO input port may be coupled through a second set of low noise amplifiers and amplitude tuning attenuators to one of the antennae or the radio frequency (RF) port.

The receiver may further include a first LO leakage cancelation circuit coupled to the RF ISO input port and including a 90 degree phase shifter to input a 90 degree phase shifted signal to the RF ISO input port of the hybrid coupler, where the 90 degree phase shifted signal may be shifted from a reflection of a LO leakage signal received from the RF ISO input port.

In the electronic receiver, the first LO leakage cancelation circuit further may include a LO leakage amplifier and an amplitude tuning attenuator coupled to the 90 degree phase shifter to send an amplified version of a reflection of a LO leakage signal reflected by the LO leakage amplifier to the RF ISO input port.

The receiver may further include a first LO leakage detector circuit coupled to an output of the first mixer; the first LO leakage detector to provide the LO leakage cancelation circuit with a LO leakage detection output signal to control an amplitude of an input signal to the 90 degree phase shifter. Here, the first LO leakage detector may include a first switch having a first switch first input coupled to an output of the adder and a first switch second input coupled to an output of a first lowpass filter to output a first low pass filtered signal of the first mixer and a first amplifier outputting an amplified version of the first low pass filtered signal as the LO leakage detection output signal; and the first switch may be selecting an output between the first switch first input and the first switch second input.

The receiver may further include a second LO leakage detector circuit coupled to an output of the second mixer; the second LO leakage detector to provide the LO leakage cancelation circuit with a LO leakage detection output signal 532 to control an amplitude of an input signal to the 90 degree phase shifter. Here the second LO leakage detector may include a second switch having a second switch first input coupled to an output of the differences and a second switch second input coupled to an output of a second lowpass filter to output a second low pass filtered signal of the second mixer and a second amplifier outputting an amplified version of the second low pass filtered signal as the LO leakage detection output signal; and the second switch may be selecting an output between the second switch first input and the second switch second input.

The receiver may further include a Test IN input port coupled to the RF ISO input port through a set of doublers/multipliers ×2 and coupled to the LO leakage cancelation circuit; the Test IN input port may be configured to receive a Tone signal at one of the LSB or USB frequency to test the LO leakage detection and LO leakage cancelation circuits.

In the receiver, the Test IN input port may be coupled to the RF ISO input port through a set of doublers/multipliers ×2; and the LO leakage detection circuits may be tested to cause LO leakage to be canceled to be at less than 0.2 dB or −40 dB.

The receiver may be disposed on at least one of a wafer or at least one radio frequencies (RF) transistor chiplet of an assembly having heterogeneous integration of the chiplets in the wafer. Here the assembly may include a host wafer having a first circuit including passive devices; at least one chiplet having a second circuit including at least one radio frequency (RF) transistor to output the RF signals; and electrical interconnects between the chiplet and the wafer, wherein the electrical interconnects electrically connect the first circuit to the second circuit.

In the receiver, the RF input circuitry before and including the coupler may be disposed on one or more of the chiplets, and wherein mixer and output circuitry after the coupler is disposed on the wafer.

The receiver may further include a first LO leakage detector circuit coupled between an output of the first mixer, an output of the third mixer and an output of the fourth mixer; wherein RF input circuitry before and including the coupler is disposed on one or more of the chiplets, wherein the first LO leakage detector circuit is disposed on the wafer, and wherein mixer and output circuitry after the coupler is disposed on the wafer.

Examples of these technologies herein include a radio frequency (RF) receiver for receiving a dual-polarization and/or dual frequency band radio frequency (RF) signal, the receiver including a hybrid coupler having a radio frequency (RF) IN input port, an RF ISO input port, an RF 0 degree I/Q output port and an RF 90 degree I/Q output port; the RF IN input port configured to receive a first RF 1 IN input signal having an H-polarization 0 degree polarized RF signal including an upper side band (USB) and a lower side band (LSB) from an RF receiver antennae. The RF ISO input port configured to receive a second RF 2 IN input signal having a V-polarization 90 degree polarized RF signal including the upper side band (USB) and the lower side band (LSB) from the RF receiver antennae. The coupler may be configured to create an I/Q I signal at the RF 0 degree I/Q output port from the input signals received at the RF IN and RF ISO input ports. This receiver may include a local oscillator (LO) to output a LO frequency signal and a first mixer coupled to the RF 0 degree I/Q output port to mix the I/Q I signal with the LO frequency signal to create a first mixer output signal; the coupler to create an I/Q Q signal at the RF 90 degree I/Q output port from the input signals received at the RF IN and RF ISO input ports. This receiver may include a second mixer coupled to the RF 90 degree I/Q output port to mix the I/Q Q signal with the LO frequency signal to create a second mixer output signal; a third mixer coupled to the output of the first mixer and to the LO to mix the first mixer output signal with the LO frequency signal output to create a third mixer output signal; and a fourth mixer coupled to the output of the second mixer and to the LO to mix the first mixer output signal with the LO frequency signal output to create a fourth mixer output signal. This receiver may include an adder to add the third mixer output signal and the fourth mixer output signal to create an adder output signal I/USB; and a differencer to subtract the third mixer output signal from the fourth mixer output signal to create a differencer output signal Q/LSB.

The RF receiver may further include a 90 degree phase shifter to create a 90 degree phase shifted signal version of the LO frequency signal output; a local oscillator I phase (LOi) signal generator to create a first LOi signal to be combined with the 90 degree phase shifted signal version of the LO frequency signal output, the first combined signal to be input into the fourth mixer which creates the fourth mixer output signal; a local oscillator Q phase (LOq) signal generator to create a first LOq signal to be combined with the LO frequency signal output, the second combined signal to be input into the third mixer which creates the third mixer output signal; a first set of down converters to mix the adder output signal I/USB with a second LOq signal to create an Hq output, and to mix the adder output signal I/USB with a second LOi signal to create a Vq output; and a second set of down converters to mix the differencer output signal Q/LSB with a third LOq signal to create an Hi output, and to mix the differencer output signal Q/LSB with a third LOi signal to create a Vi output.

The RF receiver may further include a first LO leakage cancelation circuit coupled to a Test IN input port and having: a 90 degree phase shifter to input a 90 degree phase shifted signal to the RF ISO input port of the hybrid coupler; a LO leakage amplifier and an amplitude tuning attenuator coupled between the Test IN input port and the 90 degree phase shifter to send an amplified version of TEST signal from the Test IN input port.

The RF receiver may further include a first LO leakage detector circuit coupled between an output of the first mixer, an output of the third mixer and an output of the fourth mixer; the first LO leakage detector to provide the LO leakage cancelation circuit with a LO leakage detection output signal to control an amplitude of an input signal to the 90 degree phase shifter. The first LO leakage detector may include a first detection adder to output a first addition output signal adding an output of the third mixer to an output of the fourth mixer; a first switch having a first input coupled to an output of the first detection adder and a second input coupled to an output of the first mixer through a lowpass filter and an amplifier outputting the LO leakage detection output signal; and the first switch selecting an output between the first input and the second input.

The RF receiver may further include a Test IN input port coupled to the RF ISO input port through a set of doublers/multipliers ×2 and coupled to the LO leakage cancelation circuit; the Test IN input port configured to receive a Tone signal at one of the LSB or USB frequency to test the LO leakage detection and LO leakage cancelation circuits.

Descriptions of Process

FIG. 8A shows a process flow 800 for receiving a dual-polarization and/or dual frequency band radio frequency (RF) signal. Process 800 may be performed by any of receivers (e.g., receivers or transceivers) 200-600 herein. Steps of process 800 may be performed by any appropriate receiver (e.g., receiver or transceiver) 200-600, circuit device, and/or circuit described herein for those receivers, such as described for performing the action of that step. Process 800 may be repeated to receive a different second data signal after receiving a first data signal. The first and second data signals may have the same V,H polarization and/or USB/LSB bands. The first and second data signals may have different V,H polarization and/or USB/LSB bands.

Step 810 is receiving a first RF 1 IN input signal having an H-polarization 0 degree polarized RF signal including an upper side band (USB) and a lower side band (LSB).

Step 815 is receiving a second RF 2 IN input signal having a V-polarization 90 degree polarized RF signal including the upper side band (USB) and the lower side band (LSB). Steps 810 and 815 are performed simultaneously. The H and V polar signals each have both USB and LSB and are received at the same time.

Step 820 is creating an I/Q I signal at the RF 0 degree I/Q output port from the input signals received at the RF IN and RF ISO input ports.

Step 825 is outputting a local oscillator (LO) frequency sign

Step 830 is mixing the I/Q I signal with the LO frequency signal to create a first mixer output signal.

Step 835 is creating an I/Q Q signal at an RF 90 degree I/Q output port from the input signals received at the RF IN and RF ISO input ports.

Step 840 is mixing the I/Q Q signal with the LO frequency signal to create a second mixer output signal.

Step 845 is mixing the first mixer output signal with the LO frequency signal output to create a third mixer output signal.

Step 850 is mixing the first mixer output signal with the LO frequency signal output to create a fourth mixer output signal.

Step 855 is adding the third mixer output signal and the fourth mixer output signal to create an adder output signal I/USB.

Step 860 is subtracting the third mixer output signal from the fourth mixer output signal to create a differencer output signal Q/LSB.

FIG. 8B shows a process flow 802 for receiving a dual-polarization and/or dual frequency band radio frequency (RF) signal. Process 802 may be performed by any receiver 200-600 herein. Steps of process 802 may be performed by any appropriate receiver, circuit device, and/or circuit described herein for those receivers, such as described for performing the action of that step. Process 802 may be repeated to receive a different second data signal after receiving a first data signal. The first and second data signals may have the same V,H polarization and/or USB/LSB bands. The first and second data signals may have different V,H polarization and/or USB/LSB bands.

FIG. 8B may continue from step 860 of FIG. 8A to step 865.

Step 865 is creating a 90 degree phase shifted signal version of the LO frequency signal output.

Step 870 is creating a first combined signal from a local oscillator I phase (LOi) signal combined with the 90 degree phase shifted signal version of the LO frequency signal output.

Step 875 is inputting the first combined signal into the fourth mixer which creates the fourth mixer output signal.

Step 880 is creating a second combined signal from a local oscillator Q phase (LOq) signal combined with the LO frequency signal output.

Step 882 is inputting the second combined signal into the third mixer which creates the third mixer output signal.

Step 884 is mixing the adder output signal I/USB with a second LOq signal to create an Hq output, and mixing the adder output signal I/USB with a second LOi signal to create a Vq output.

Step 886 is mixing the differencer output signal Q/LSB with a third LOq signal to create an Hi output, and mixing the differencer output signal Q/LSB with a third LOi signal to create a Vi output.

FIG. 8B steps 888-892 show a further process of flow 802 for receiving dual-polarization and/or dual frequency band radio frequency (RF) signals with leakage and image rejection calibration. Steps 888-892 may be performed by any appropriate receiver, LO leakage cancellation circuit, LO leakage detection circuit, circuit device, and/or circuit described herein, such as described for performing the action of that step. Steps 888-892 may be repeated to receive a different second data signal after receiving a first data signal, with either signal having LO leakage. The first and second data signals may have the same V,H polarization and/or USB/LSB bands, and either and/or both signals may have LO leakage. The first and second data signals may have different V,H polarization and/or USB/LSB bands, and either and/or both signals may have LO leakage.

Steps 888-892 may continue from step 886 of FIG. 8B or step 860 of FIG. 8A to step 888.

Step 888 is canceling LO leakage using a Test IN input port, including by inputting a 90 degree phase shifted signal to the RF ISO input port of the hybrid coupler, and by sending an amplified version of a TEST signal from the Test IN input port of a 90 degree phase shifter to be the 90 degree phase shifted ISO input signal.

Step 890 is detecting LO leakage at an output of a first mixer, including by outputting a first addition output signal by adding an output of the third mixer to an output of the fourth mixer, and by switching between a first input coupled to an output of the first detection adder and a second input coupled to an output of the first mixer to output the LO leakage detection output signal.

Step 892 is providing the LO leakage detection output signal to control an amplitude of an input signal to the 90 degree phase shifter based on the detecting LO leakage.

FIG. 9A shows process flow 900 for receiving dual-polarization and/or dual frequency band radio frequency (RF) signals with leakage and image rejection calibration. Process 900 may be performed by any receiver (e.g., receiver or transceiver) herein. Steps of process 900 may be performed by any appropriate receiver (e.g., receiver or transceiver), circuit device, and/or circuit described herein, such as described for performing the action of that step. Process 900 may be repeated to receive (e.g., receive and/or transmit) a different second data signal after receiving a first data signal. The first and second data signals may have the same V,H polarization and/or USB/LSB bands. The first and second data signals may have different V,H polarization and/or USB/LSB bands.

Step 910 is receiving a radio frequency (RF) signal including an upper side band (USB) and a lower side band (LSB). This may be done by or at circuitry to the left of and optionally including coupler 220 or 320 in the FIGS (e.g., port 210 to coupler 200; or ports 310 and 311 to coupler 320).

Step 920 is down converting the RF signal to provide an image band and an RF band based on the RF signal using a local oscillator (LO) having an LO frequency between a USB frequency and an LSB frequency. This may be done by or at LO 230, coupler 200, mixers 222-240 and mixers 224-250; or LO 330, coupler 320, mixers 322-340 and mixers 324-350).

Then, step 930 is recombining, using the LO frequency and a plurality of summing paths, the image band and the RF band to provide the USB and the LSB. This may be done by or at adder 260 and differencer 270; or adder 360, and differencer 370.

FIG. 9B shows process flow 902 for transmitting a radio frequency (RF) signal. Process 902 may be performed by any transceiver (e.g., transmitter or transceiver) herein. Steps of process 902 may be performed by any appropriate transmitter (e.g., transceiver), circuit device, and/or circuit described herein, such as described for performing the action of that step. Process 902 may be repeated to transmit a different second data signal after transmitting a first data signal. The first and second data signals may have the same V,H polarization and/or USB/LSB bands. The first and second data signals may have different V,H polarization and/or USB/LSB bands.

Step 940 is combining, using a local oscillator (LO) frequency of an LO and a plurality of summing paths, an upper side band (USB) and a lower side band (LSB) to provide an image (IM) band and an RF band. This may be done by or at adder 260 and differencer 270; or adder 360, and differencer 370.

Next, step 950 is up converting the IM band and the RF band to provide an RF signal using the LO, the LO frequency being between a USB frequency and an LSB frequency. This may be done by or at LO 230, coupler 200, mixers 222-240 and mixers 224-250; or LO 330, coupler 320, mixers 322-340 and mixers 324-350).

Then, step 960 is transmitting the RF signal including the USB and the LSB. This may be done by or at circuitry to the left of and optionally including coupler 220 or 320 in the FIGS (e.g., port 210 to coupler 200; or ports 310 and 311 to coupler 320).

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A system for receiving or transmitting signals, comprising:
   a radio frequency (RF) port configured to receive or transmit an RF signal including an upper side band (USB) and a lower side band (LSB);
   a first mixer coupled with the RF port and configured to convert between the RF signal and an image (IM) band and an RF band; and
   selection architecture, coupled with the first mixer and including a second mixer, the selection architecture configured to output or receive the USB and the LSB based on the RF band and the IM band;
   wherein the RF port, the first mixer, and the selection architecture are included in a heterogeneous integrated device;
   wherein the heterogeneous integrated device includes an interposer configured to couple the RF port, the first mixer, and the selection architecture; and
   wherein the interposer further includes complementary metal-oxide semiconductor (CMOS) devices.

2. The system of claim 1, wherein the selection architecture further includes:
   a plurality of summing paths coupled with the second mixer.

3. The system of claim 1, further comprising:
   a local oscillator (LO) having an LO frequency and coupled with the first mixer and the second mixer, the LO frequency being between a USB frequency and an LSB frequency.

4. The system of claim 1, wherein the first mixer down converts the USB and the LSB to an intermediate frequency (IF) band.

5. The system of claim 1, further comprising:
   a phase shifter coupled with the first mixer and the RF port.

6. The system of claim 5, wherein the first mixer provides an in-phase band and a quadrature band and wherein the phase shifter is a ninety degree phase shifter.

7. The system of claim 1, wherein the selection architecture further includes:
   at least one plurality impedance configured for image rejection.

8. The system of claim 1, wherein the CMOS devices are configured to monitor at least one of gain and phase imbalances for the system.

9. A system for receiving or transmitting signals, comprising:
   a radio frequency (RF) port configured to receive or transmit an RF signal including an upper side band (USB) and a lower side band (LSB);
   a first mixer coupled with the RF port and configured to convert between the RF signal and an image (IM) band and an RF band; and
   selection architecture, coupled with the first mixer and including a second mixer, the selection architecture configured to output or receive the USB and the LSB based on the RF band and the IM band;

wherein the selection architecture further includes a plurality of summing paths coupled with the second mixer;

wherein the first mixer provides an in-phase band and a quadrature band corresponding to the RF band and the IM band; and wherein the plurality of summing paths includes a sum path for one of the USB or the LSB and a difference path for an other of the LSB or the USB.

10. The system of claim 9, wherein the second mixer includes:

an in-phase band mixer; and a quadrature band mixer;

wherein each of the sum path and the difference path is coupled with the in-phase band mixer and the quadrature band mixer.

11. A system for receiving or transmitting signals, comprising:

a radio frequency (RF) port configured to receive or transmit an RF signal including an upper side band (USB) and a lower side band (LSB);

a first mixer coupled with the RF port and configured to convert between the RF signal and an image (IM) band and an RF band; and selection architecture, coupled with the first mixer and including a second mixer, the selection architecture configured to output or receive the USB and the LSB based on the RF band and the IM band;

wherein the RF port is configured to receive or transmit a plurality of polarizations, the plurality of polarizations being orthogonal; and wherein the selection architecture is configured to separately output or receive a first polarization and a second polarization of the plurality of polarizations.

12. The system of claim 11, wherein the selection architecture further includes:

a plurality of down converters for separately providing the first polarization for the USB, the second polarization for the USB, the first polarization for the LSB, and the second polarization for the LSB.

13. An integrated heterogeneous device comprising:

a system configured to receive or transmit signals including a radio frequency (RF) port, a first mixer, and selection architecture, the RF port being configured to receive or transmit an RF signal including an upper side band (USB) and a lower side band (LSB), the first mixer being coupled with the RF port and being configured to convert between the RF signal and an image (IM) band and an RF band, the selection architecture being coupled with the first mixer and including a second mixer, the selection architecture being configured to output or receive the USB and the LSB based on the IM band and the RF band; and an interposer configured to electrically and mechanically couple the RF port, the first mixer, and the selection architecture;

wherein the interposer includes complementary metal-oxide semiconductor (CMOS) devices.

14. The integrated heterogeneous device of claim 13, wherein the system further includes:

a phase shifter coupled with the first mixer and the RF port.

15. The integrated heterogeneous device of claim 13, wherein the selection architecture further includes:

at least one plurality impedance configured for image rejection.

16. The integrated heterogeneous device of claim 13, wherein the CMOS devices are configured to monitor at least one of gain and phase imbalances for the system.

17. An integrated heterogeneous device comprising:

a system configured to receive or transmit signals including a radio frequency (RF) port, a first mixer, and selection architecture, the RF port being configured to receive or transmit an RF signal including an upper side band (USB) and a lower side band (LSB), the first mixer being coupled with the RF port and being configured to convert between the RF signal and an image (IM) band and an RF band, the selection architecture being coupled with the first mixer and including a second mixer, the selection architecture being configured to output or receive the USB and the LSB based on the IM band and the RF band; and an interposer configured to electrically and mechanically couple the RF port, the first mixer, and the selection architecture;

wherein the system further comprises:

a local oscillator (LO) having an LO frequency and coupled with the first mixer and the second mixer, the LO frequency being between a USB frequency and an LSB frequency;

wherein the first mixer provides an in-phase band and a quadrature band corresponding to the IM band and the RF band; and wherein the selection architecture includes a sum path coupled with the second mixer and a difference path coupled with the second mixer, the sum path for one of the USB or the LSB and the difference path for an other of the LSB and the USB.

18. An integrated heterogeneous device comprising:

a system configured to receive or transmit signals including a radio frequency (RF) port, a first mixer, and selection architecture, the RF port being configured to receive or transmit an RF signal including an upper side band (USB) and a lower side band (LSB), the first mixer being coupled with the RF port and being configured to convert between the RF signal and an image (IM) band and an RF band, the selection architecture being coupled with the first mixer and including a second mixer, the selection architecture being configured to output or receive the USB and the LSB based on the IM band and the RF band; and an interposer configured to electrically and mechanically couple the RF port, the first mixer, and the selection architecture;

wherein the RF port is configured to receive or transmit a plurality of polarizations; and wherein the selection architecture is configured to separately output or receive a first polarization and a second polarization of the plurality of polarizations.

19. A method, comprising:

receiving, at a radio frequency (RF) port, a radio frequency (RF) signal including an upper side band (USB) and a lower side band (LSB);

down converting, in a first mixer coupled with the RF port, the RF signal to provide an image band and an RF band based on the RF signal using a local oscillator (LO) having an LO frequency between a USB frequency and an LSB frequency; and recombining, using selection architecture, coupled with the first mixer and including a second mixer, using the LO frequency and a plurality of summing paths, the image band and the RF band to provide the USB and the LSB;

wherein the RF port, the first mixer, and the selection architecture are included in a heterogeneous integrated device;

wherein the heterogeneous integrated device includes an interposer configured to couple the RF port, the first mixer, and the selection architecture; and wherein the interposer further includes complementary metal-oxide semiconductor (CMOS) devices.

* * * * *